(12) United States Patent
Chu et al.

(10) Patent No.: US 10,508,029 B2
(45) Date of Patent: Dec. 17, 2019

(54) MEMS INTEGRATED PRESSURE SENSOR DEVICES AND METHODS OF FORMING SAME

(71) Applicant: Taiwan Semiconductor Manufacturing Company, Ltd., Hsinchu (TW)

(72) Inventors: Chia-Hua Chu, Zhubei (TW); Chun-Wen Cheng, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/023,509

(22) Filed: Jun. 29, 2018

(65) Prior Publication Data

US 2018/0305201 A1    Oct. 25, 2018

Related U.S. Application Data

(60) Division of application No. 15/043,850, filed on Feb. 15, 2016, now Pat. No. 10,017,382, which is a
(Continued)

(51) Int. Cl.
*B81C 1/00*    (2006.01)
*B81B 3/00*    (2006.01)
(Continued)

(52) U.S. Cl.
CPC ........ *B81C 1/00293* (2013.01); *B81B 3/0021* (2013.01); *B81B 7/0041* (2013.01); *B81B 7/02* (2013.01); *B81B 7/04* (2013.01); *B81C 1/00134* (2013.01); *B81C 1/00309* (2013.01); *G01C 19/56* (2013.01); *G01C 19/5769* (2013.01); *G01L 9/0044* (2013.01);
(Continued)

(58) Field of Classification Search
None
See application file for complete search history.

(56) References Cited

U.S. PATENT DOCUMENTS 8,216,882 B2    7/2012  Lin et al.
8,350,346 B1    1/2013  Huang et al.
(Continued)

FOREIGN PATENT DOCUMENTS

TW    201242382 A    10/2012
WO    2012122872 A1    9/2012

*Primary Examiner* — Thien F Tran
(74) *Attorney, Agent, or Firm* — Slater Matsil, LLP

(57) ABSTRACT

A method embodiment includes providing a micro-electromechanical (MEMS) wafer including a polysilicon layer having a first and a second portion. A carrier wafer is bonded to a first surface of the MEMS wafer. Bonding the carrier wafer creates a first cavity. A first surface of the first portion of the polysilicon layer is exposed to a pressure level of the first cavity. A cap wafer is bonded to a second surface of the MEMS wafer opposite the first surface of the MEMS wafer. The bonding the cap wafer creates a second cavity comprising the second portion of the polysilicon layer and a third cavity. A second surface of the first portion of the polysilicon layer is exposed to a pressure level of the third cavity. The first cavity or the third cavity is exposed to an ambient environment.

19 Claims, 28 Drawing Sheets

Related U.S. Application Data continuation of application No. 14/713,269, filed on May 15, 2015, now Pat. No. 9,260,296, which is a division of application No. 13/894,821, filed on May 15, 2013, now Pat. No. 9,040,334.

(60) Provisional application No. 61/784,115, filed on Mar. 14, 2013.

(51) Int. Cl.

| | | |
|---|---|---|
| *G01P 15/00* | (2006.01) | |
| *G01L 19/00* | (2006.01) | |
| *G01L 9/00* | (2006.01) | |
| *G01P 15/08* | (2006.01) | |
| *G01P 15/125* | (2006.01) | |
| *G01C 19/5769* | (2012.01) | |
| *B81B 7/02* | (2006.01) | |
| *G01C 19/56* | (2012.01) | |
| *B81B 7/04* | (2006.01) | |
| *B81B 7/00* | (2006.01) | |

(52) U.S. Cl.
CPC ...... *G01L 19/0076* (2013.01); *G01L 19/0092* (2013.01); *G01P 15/00* (2013.01); *G01P 15/0802* (2013.01); *G01P 15/125* (2013.01); *B81B 7/007* (2013.01); *B81B 2201/025* (2013.01); *B81B 2201/0235* (2013.01); *B81B 2201/0242* (2013.01); *B81B 2201/0264* (2013.01); *B81C 2201/013* (2013.01); *B81C 2203/0118* (2013.01)

(56) References Cited

U.S. PATENT DOCUMENTS

| | | |
|---|---|---|
| 8,513,747 B1 | 8/2013 | Huang et al. |
| 8,524,519 B2 | 9/2013 | Wang et al. |
| 8,802,473 B1 | 8/2014 | Chu et al. |
| 8,890,191 B2 | 11/2014 | Shiu et al. |
| 9,040,334 B2 | 5/2015 | Chu et al. |
| 9,085,455 B2 | 7/2015 | Cheng et al. |
| 9,187,317 B2 | 11/2015 | Cheng et al. |
| 9,260,295 B2 | 2/2016 | Chu et al. |
| 9,260,296 B2 | 2/2016 | Chu et al. |
| 10,017,382 B2 * | 7/2018 | Chu .................... B81C 1/00134 |
| 2005/0037534 A1 | 2/2005 | Sawyer |
| 2005/0176179 A1 | 8/2005 | Ikushima et al. |
| 2006/0016486 A1 | 1/2006 | Teach et al. |
| 2007/0099395 A1 | 5/2007 | Sridhar et al. |
| 2007/0231943 A1 | 10/2007 | Ouellet et al. |
| 2008/0192963 A1 | 8/2008 | Sato |
| 2011/0121412 A1 | 5/2011 | Quevy et al. |
| 2012/0038372 A1 | 2/2012 | Reinmuth et al. |
| 2012/0043627 A1 | 2/2012 | Lin et al. |
| 2012/0098074 A1 | 4/2012 | Lin et al. |
| 2012/0261744 A1 | 10/2012 | Wang et al. |
| 2012/0261774 A1 | 10/2012 | Graham et al. |
| 2012/0261775 A1 | 10/2012 | Wang et al. |
| 2012/0280594 A1 | 11/2012 | Chen et al. |
| 2012/0326248 A1 | 12/2012 | Daneman et al. |
| 2013/0108074 A1 | 5/2013 | Reining |
| 2013/0214370 A1 | 8/2013 | Hussain et al. |
| 2013/0283912 A1 | 10/2013 | Lin |
| 2013/0334620 A1 | 12/2013 | Chu et al. |
| 2014/0042562 A1 | 2/2014 | Chu et al. |
| 2014/0264648 A1 | 9/2014 | Chu et al. |
| 2014/0264653 A1 | 9/2014 | Cheng et al. |
| 2014/0264661 A1 | 9/2014 | Cheng et al. |
| 2014/0264662 A1 | 9/2014 | Cheng et al. |
| 2014/0319631 A1 | 10/2014 | Chu |
| 2015/0246807 A1 | 9/2015 | Chu et al. |
| 2015/0307346 A1 | 10/2015 | Cheng et al. |
| 2016/0060104 A1 | 3/2016 | Chu et al. |
| 2016/0159643 A1 | 6/2016 | Chu |
| 2016/0159644 A1 | 6/2016 | Chu |

\* cited by examiner

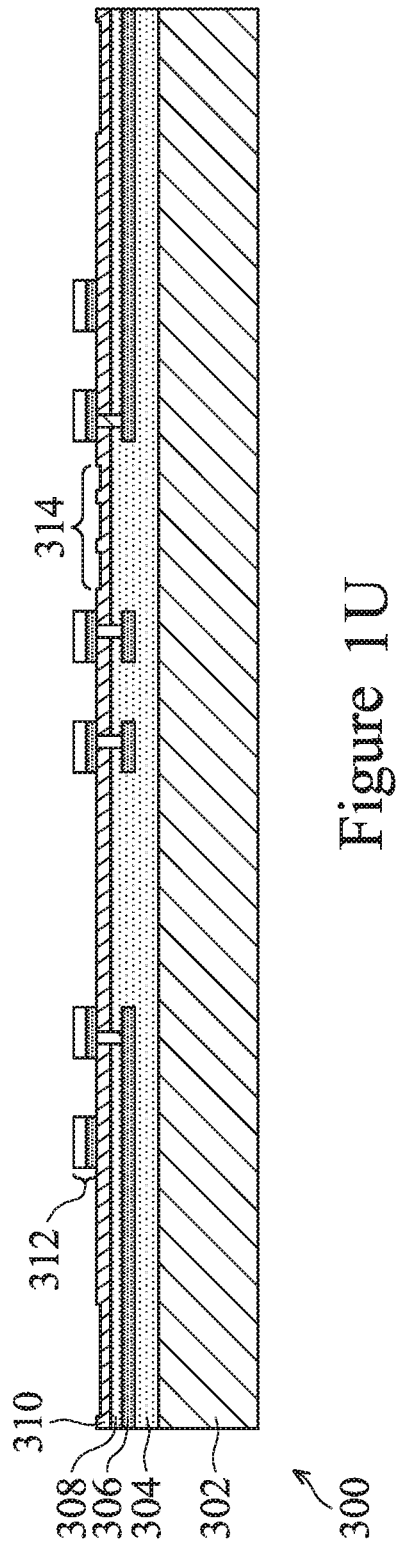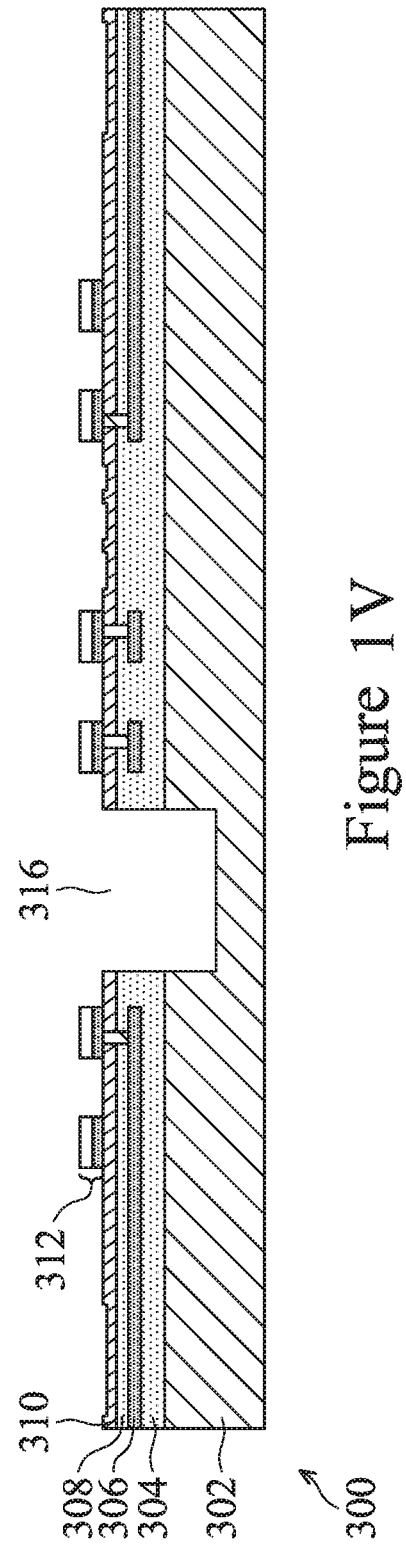

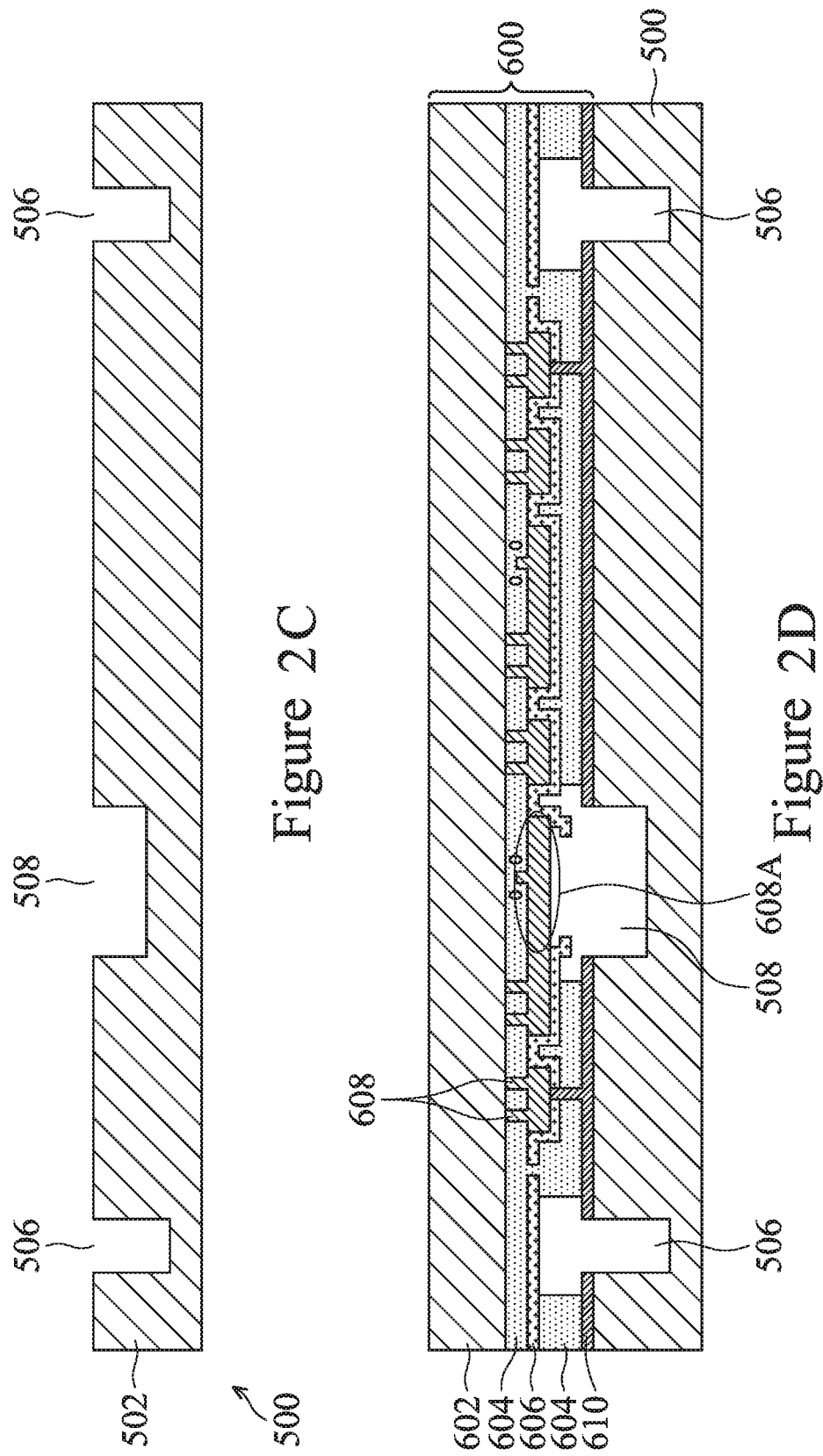

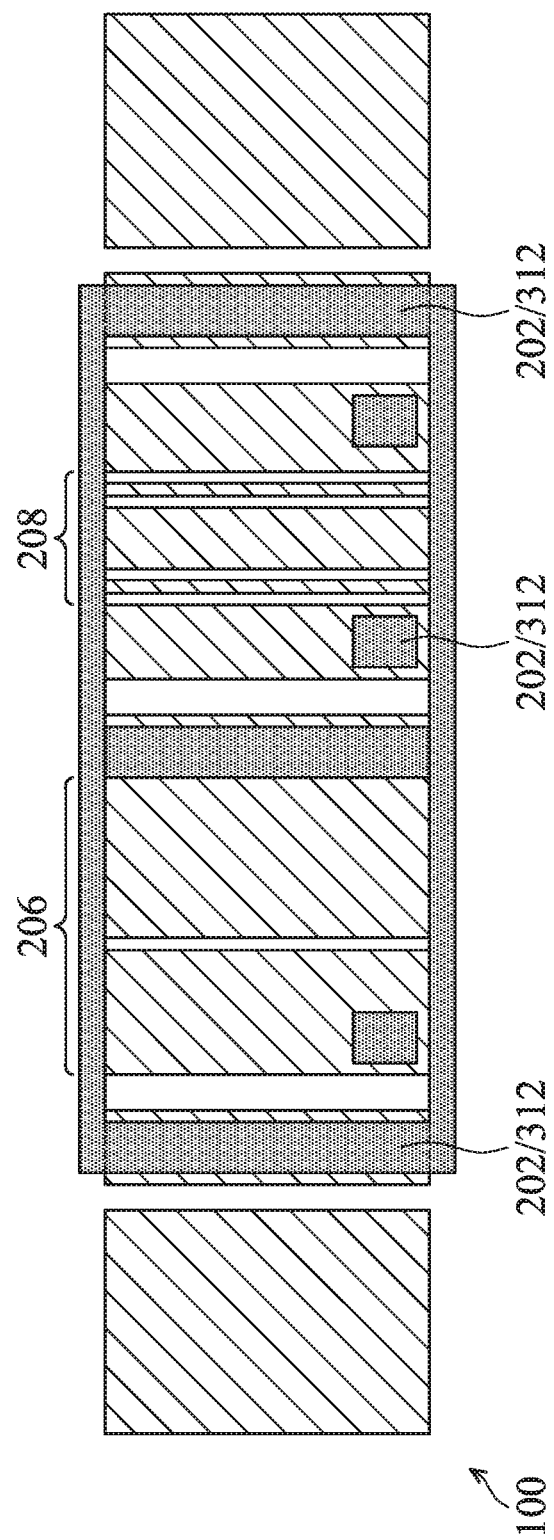

MEMS INTEGRATED PRESSURE SENSOR DEVICES AND METHODS OF FORMING SAME

This application is a divisional of application Ser. No. 15/043,850, filed on Feb. 15, 2016 which is a continuation of application Ser. No. 14/713,269, filed on May 15, 2015 which is a divisional of application Ser. No. 13/894,821, filed on May 15, 2013, entitled "MEMS Integrated Pressure Sensor Devices and Methods of Forming Same," which claims the benefit of U.S. Provisional Application No. 61/784,115, filed on Mar. 14, 2013, entitled "MEMS Pressure and Motion Sensor Devices and Methods of Forming Same," which applications are hereby incorporated herein by reference.

BACKGROUND

Micro-electromechanical systems ("MEMS") are becoming increasingly popular, particularly as such devices are miniaturized and are integrated into integrated circuit manufacturing processes. MEMS devices introduce their own unique requirements into the integration process, however. Electrically interconnecting MEMS devices is an area of unique challenges. In particular, integrating MEMS pressure sensor devices with other MEMS devices (e.g., motion sensor devices) into the same integrated circuit manufacturing process has posed challenges.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 2A-2I are cross-sectional views of intermediate stages of manufacture of a MEMS device in accordance with various alternative embodiments;

FIG. 3 is a top-down view of a portion of a MEMS wafer in accordance with various embodiments.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Figure 1A:
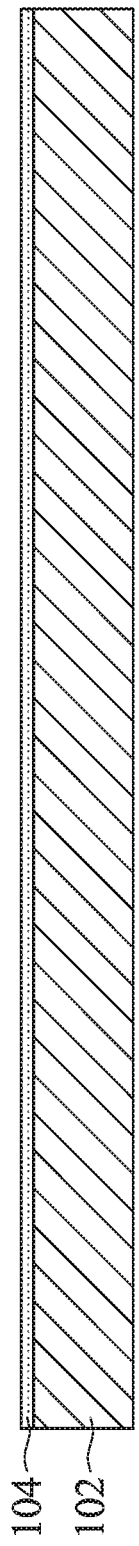
FIGS. 1A-1Z are cross-sectional views of intermediate stages of manufacture of a MEMS device in accordance with various embodiments.
Figure 1B:
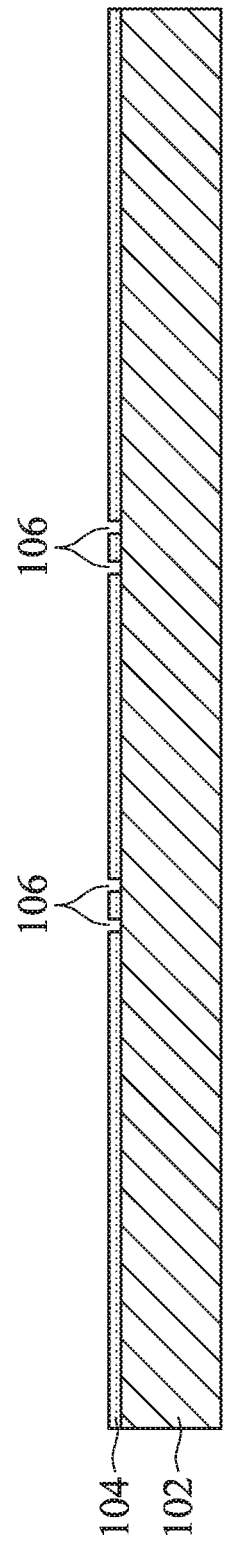
Figure 1C:
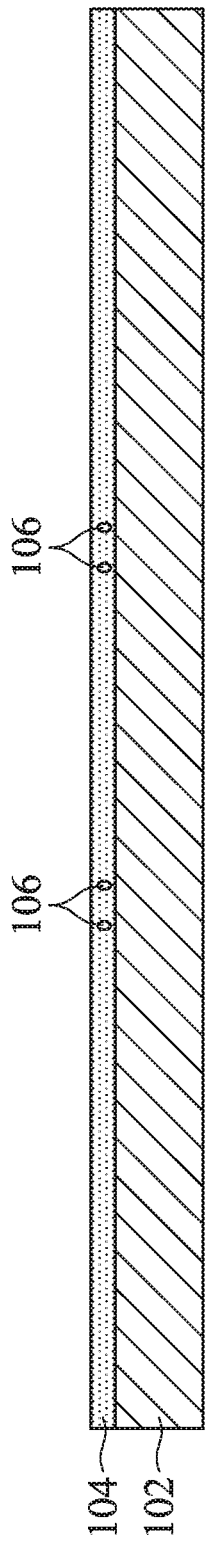
Figure 1D:
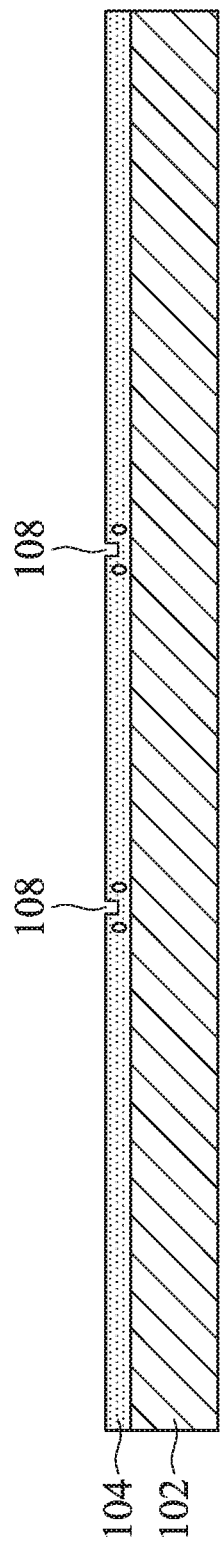
Figure 1E:
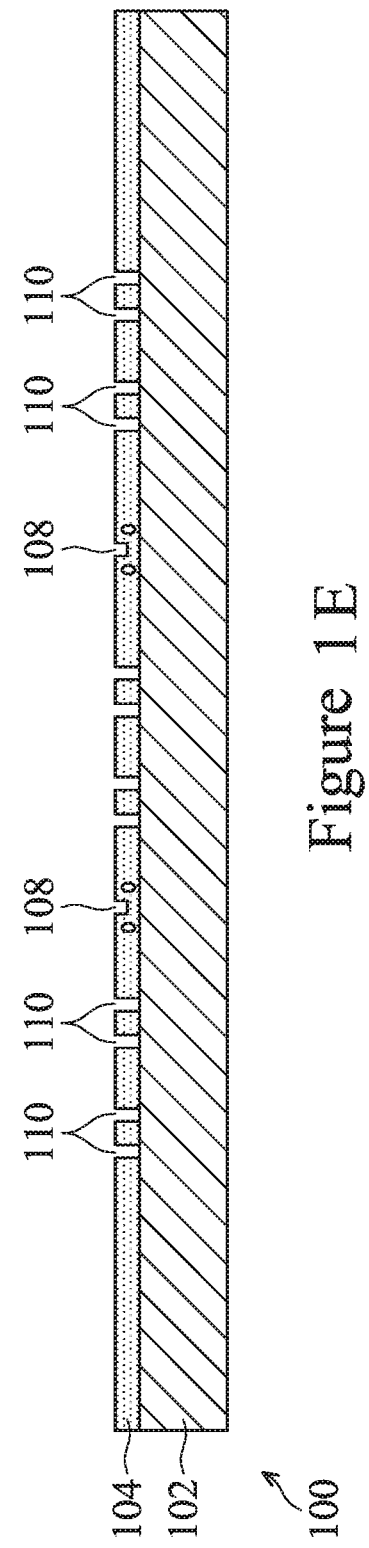
Figure 1F:
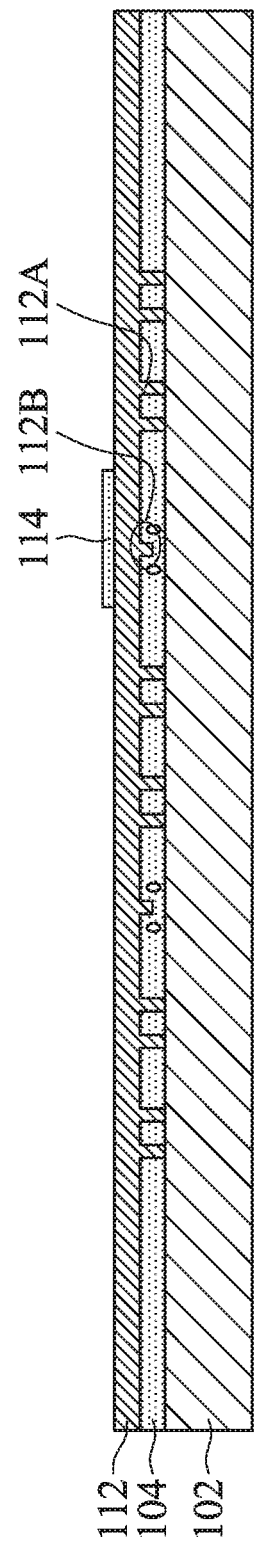
Figure 1G:
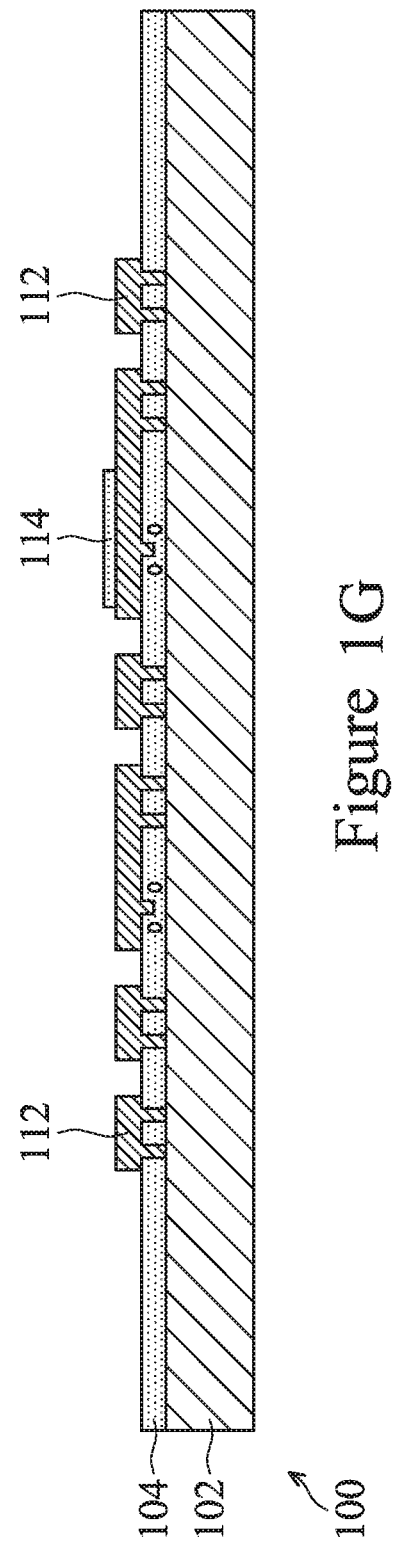
Figure 1H:
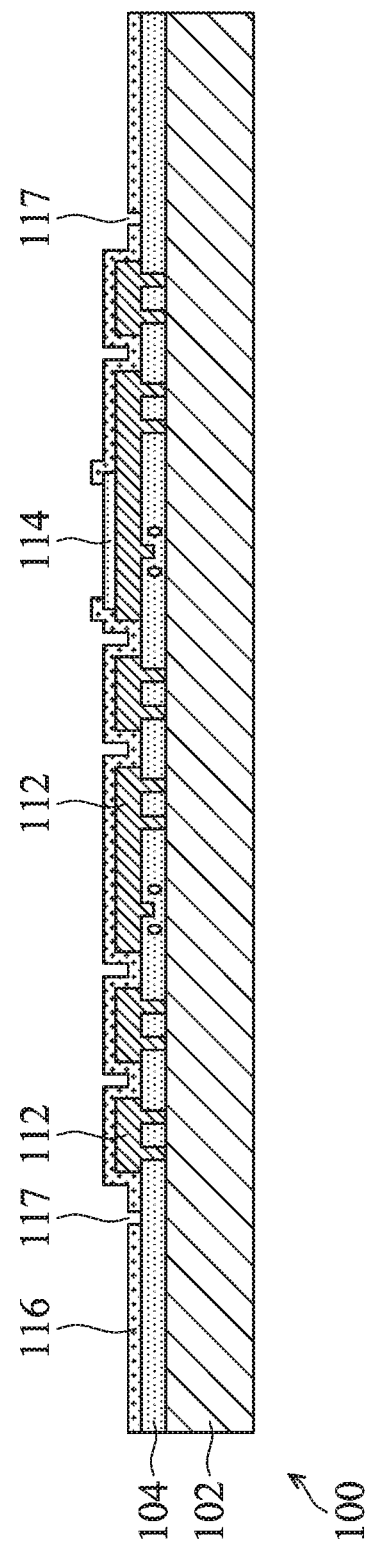
Figure 1I:
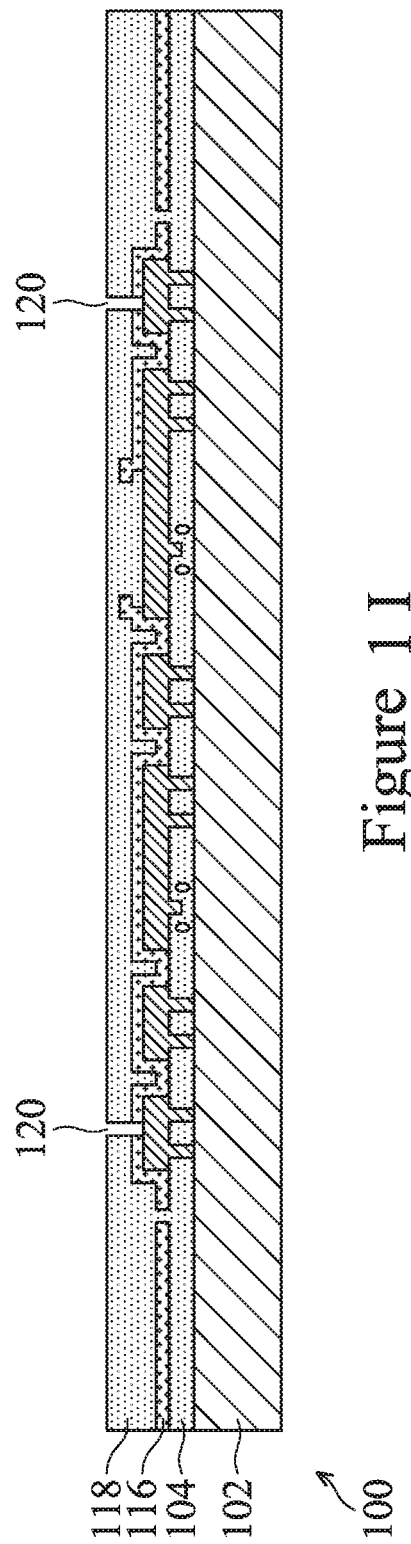
Figure 1J:
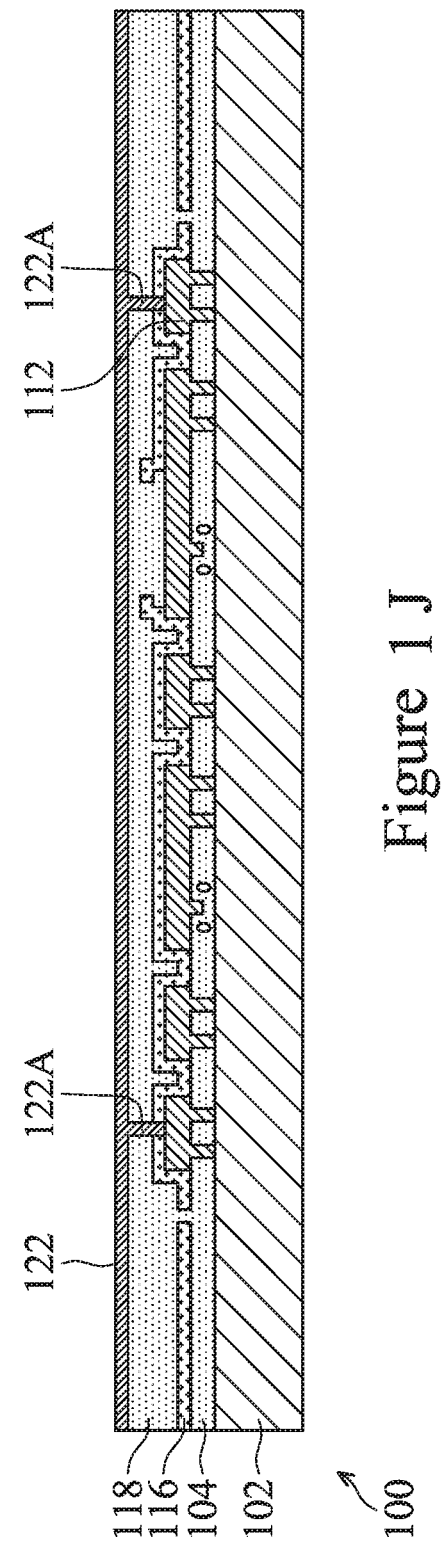
Figure 1K:
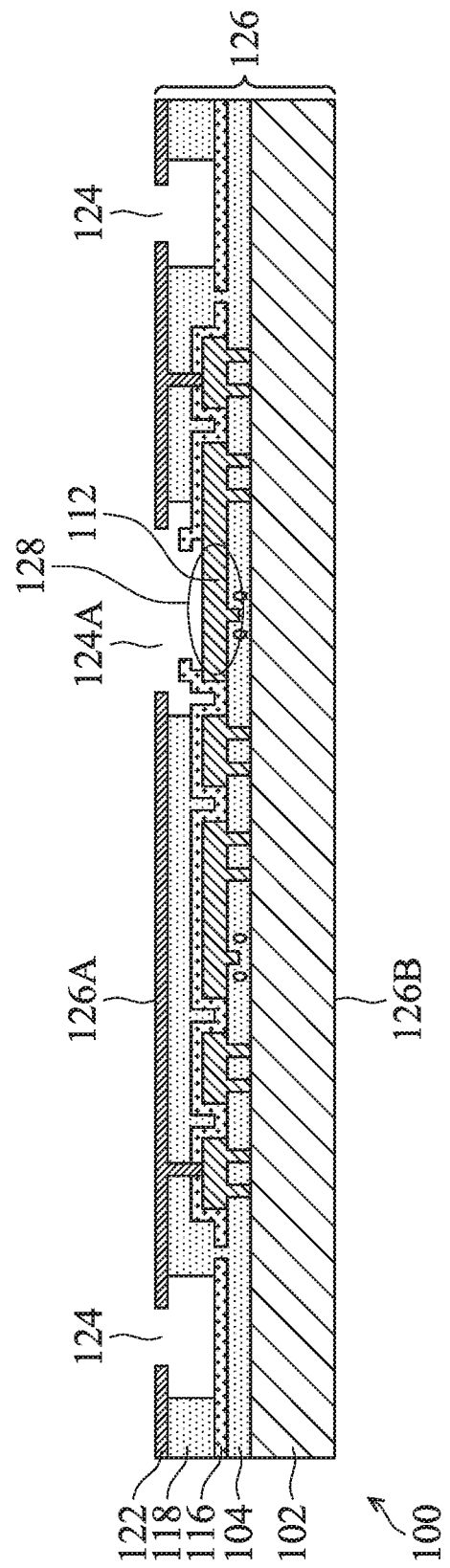
Figure 1L:
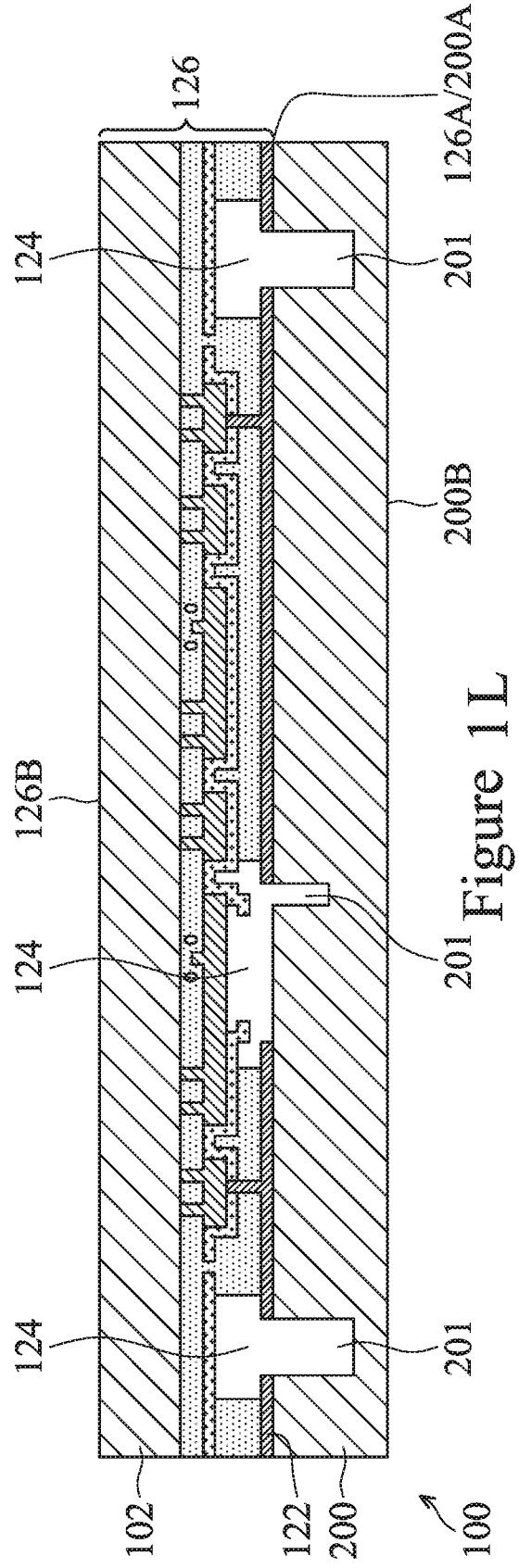
Figure 1M:
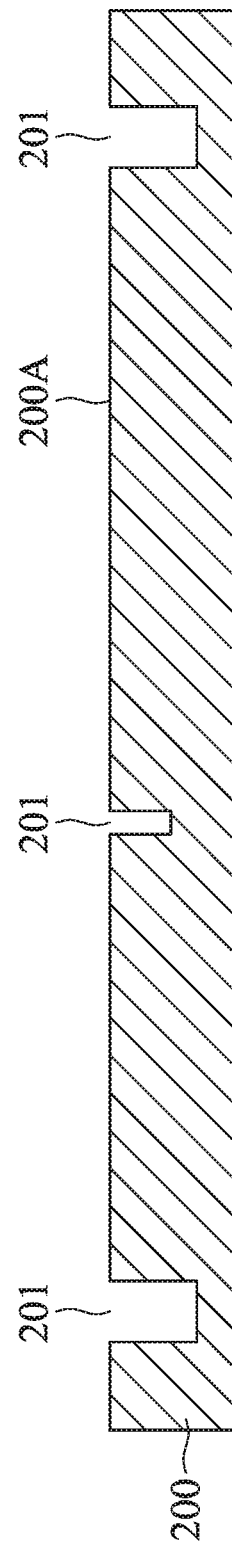
Figure 1N:
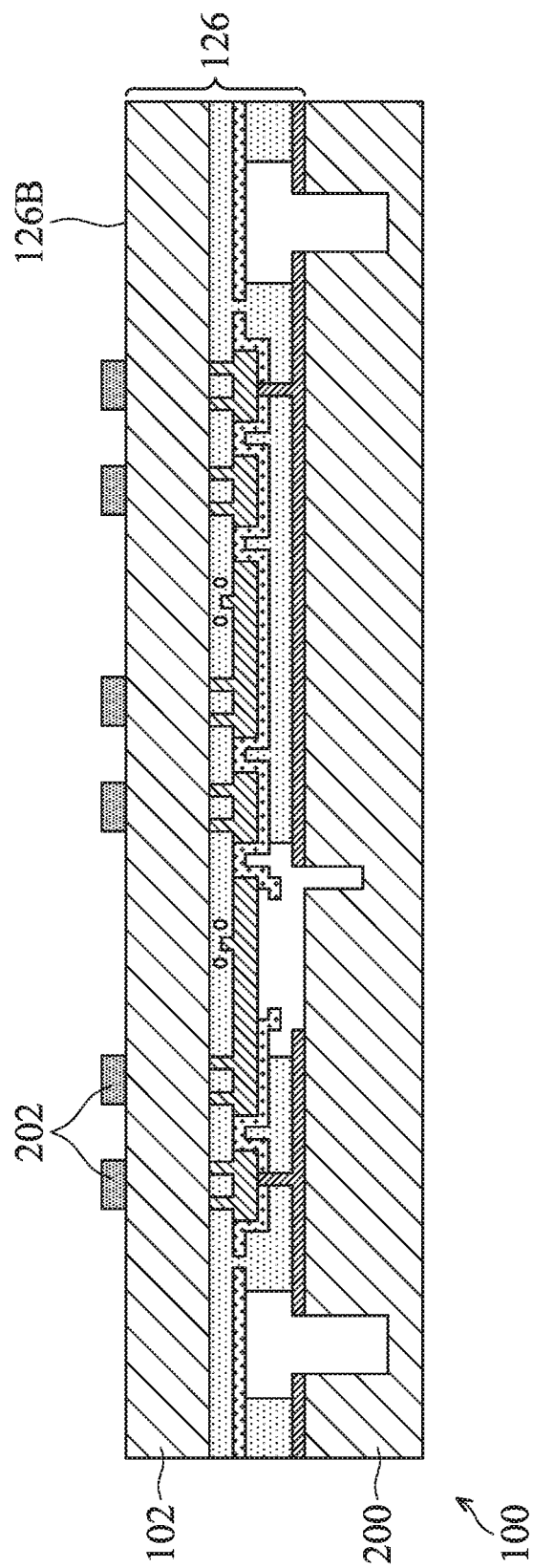
Figure 10:
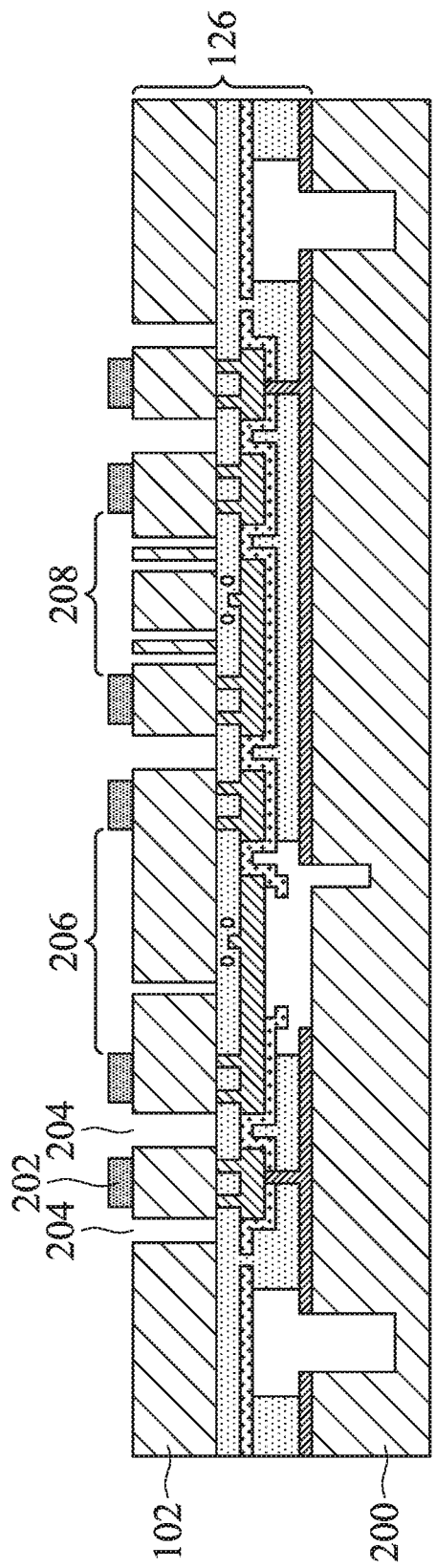
Figure 1P:
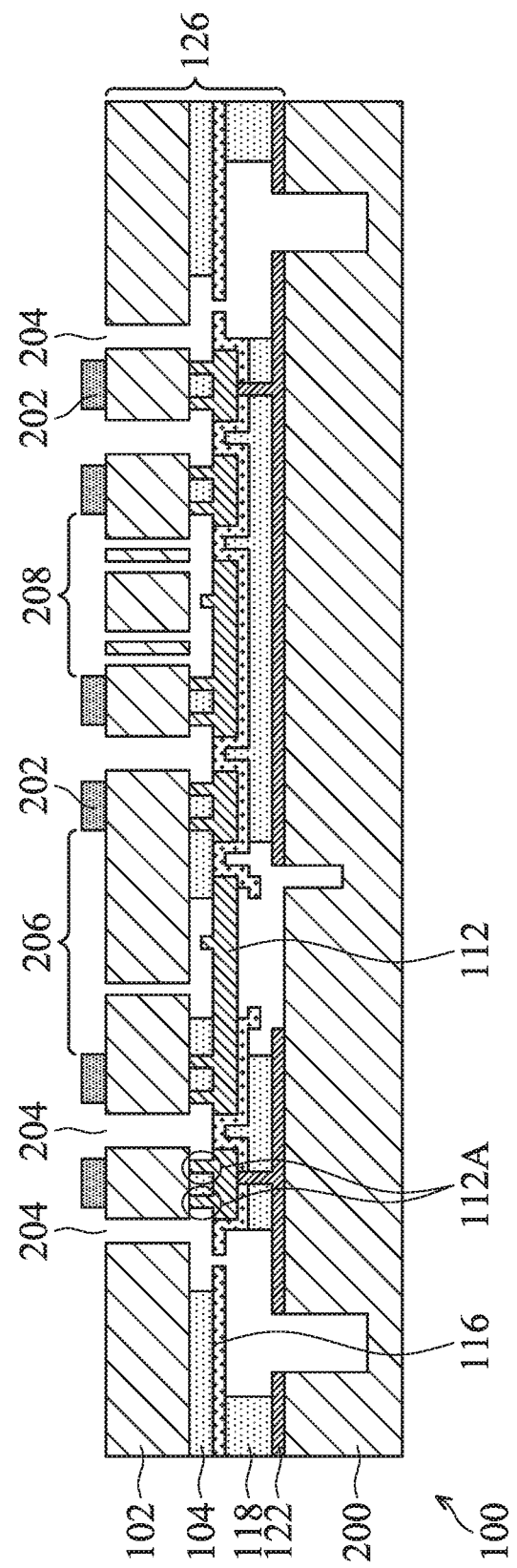
Figure 1Q:
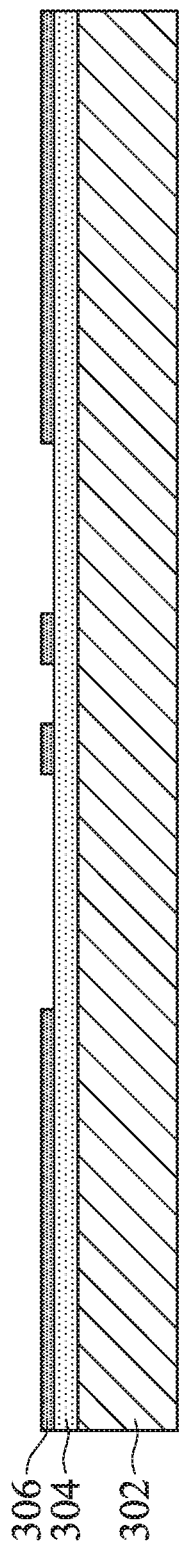
Figure 1R:
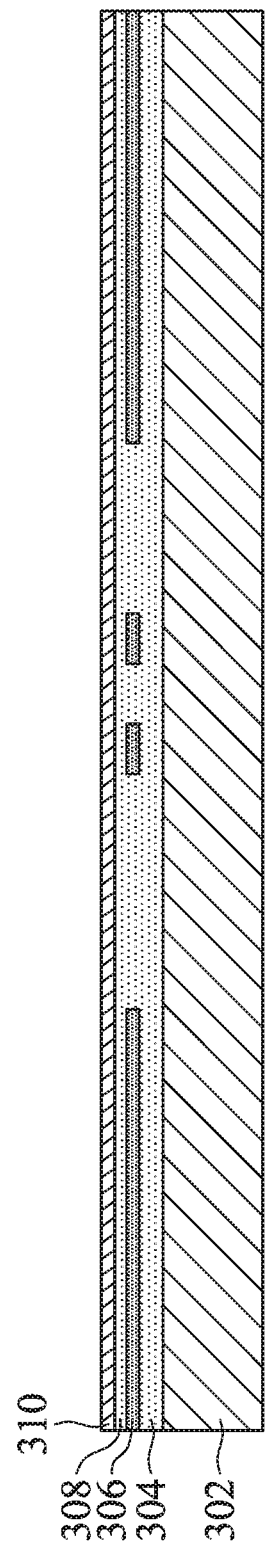
Figure 1S:
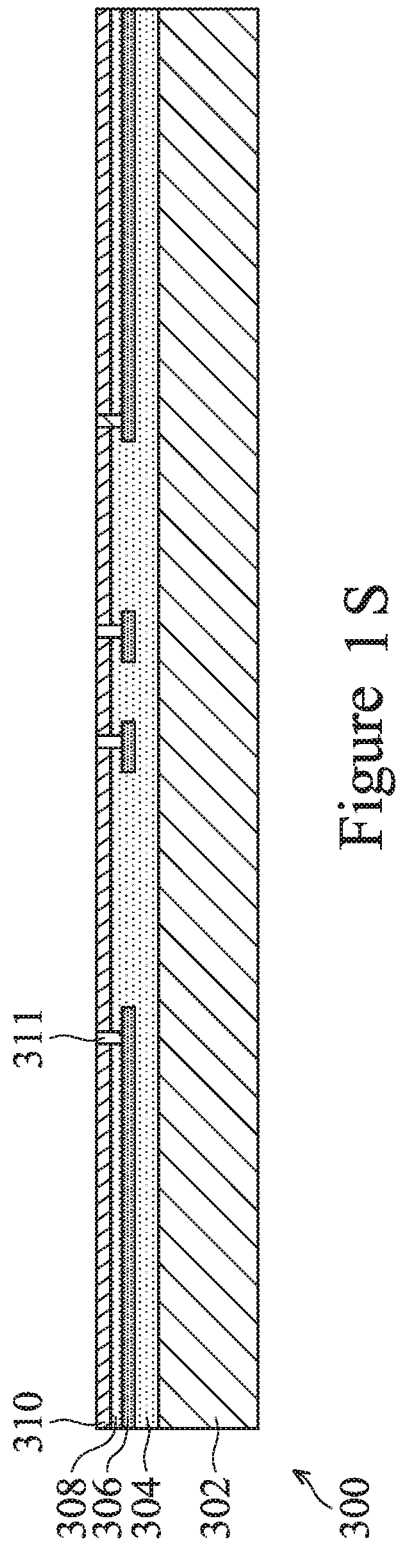
Figure 1T:
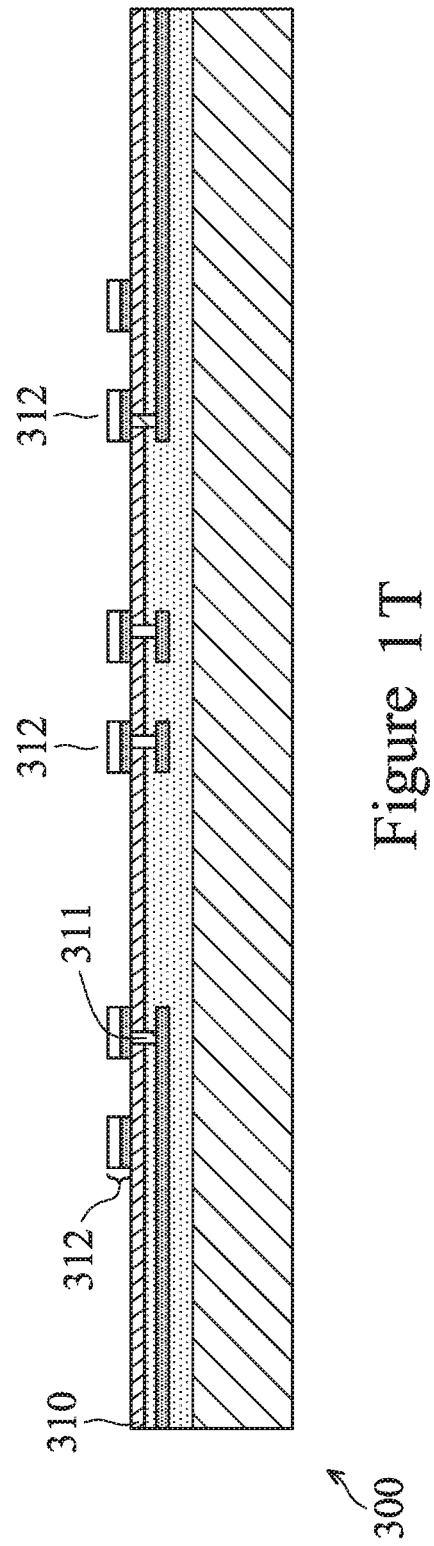
Figure 1W:
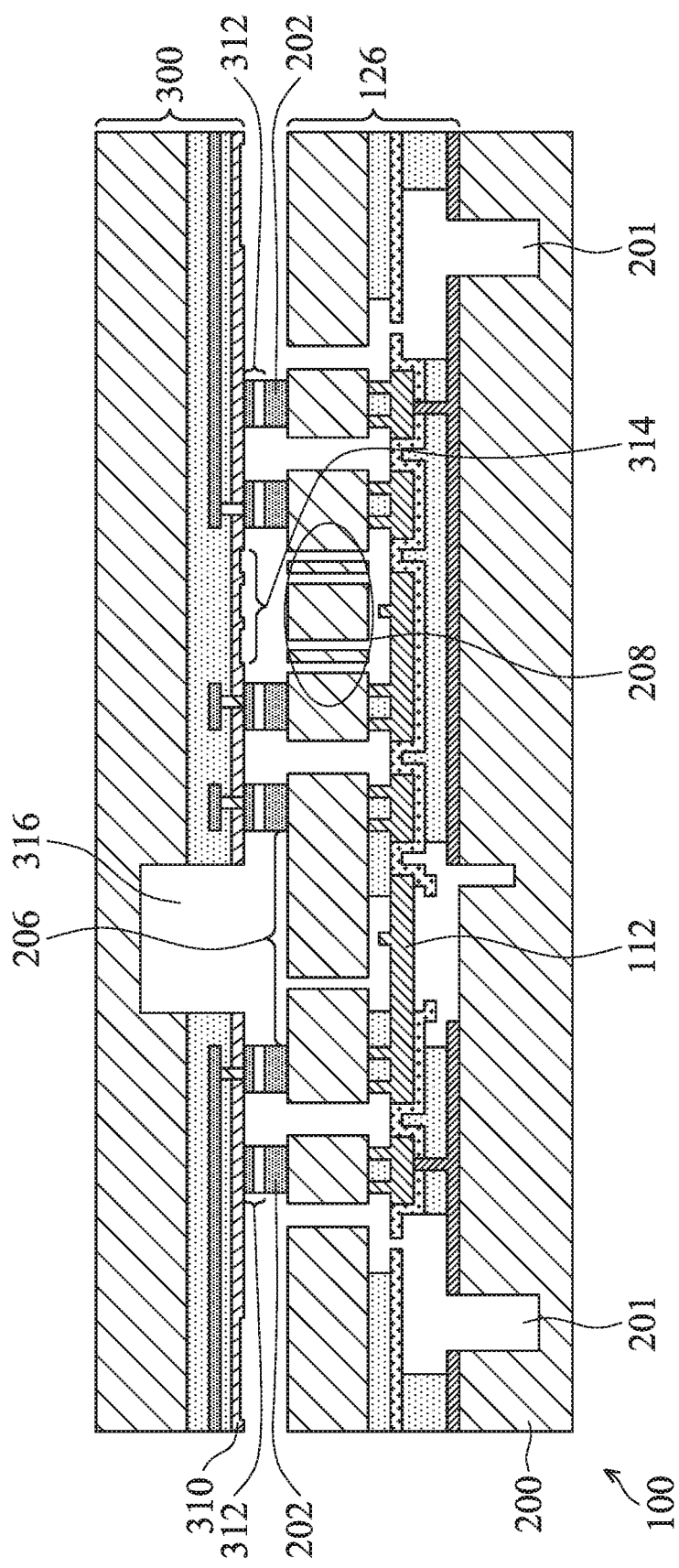
Figure 1X:
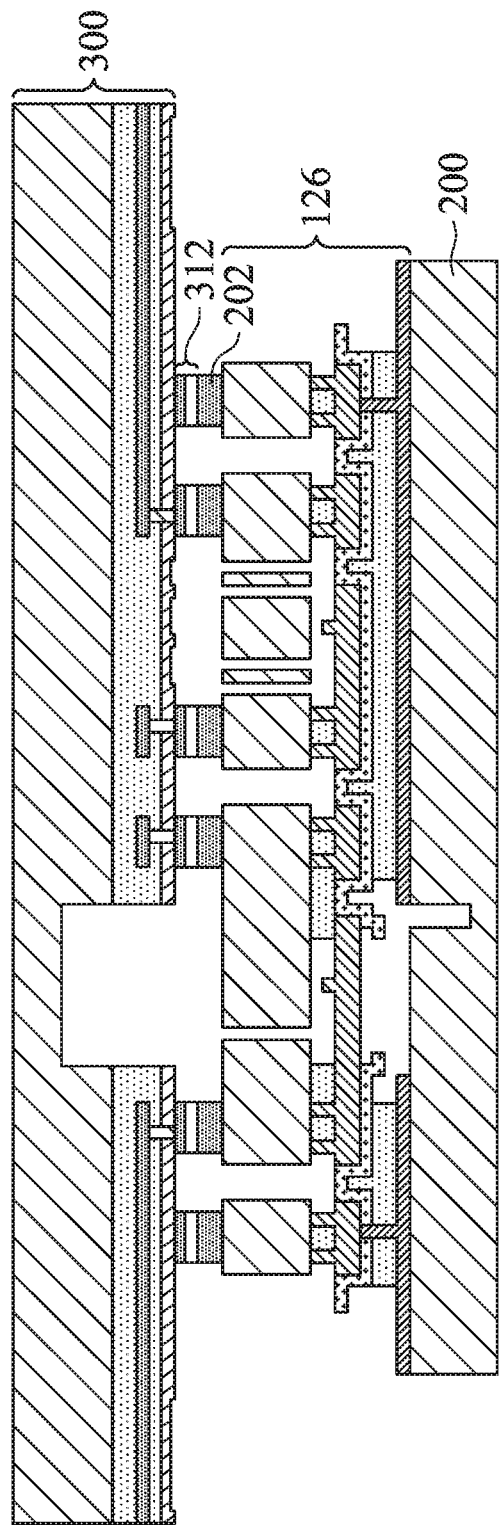
Figure 1Y:
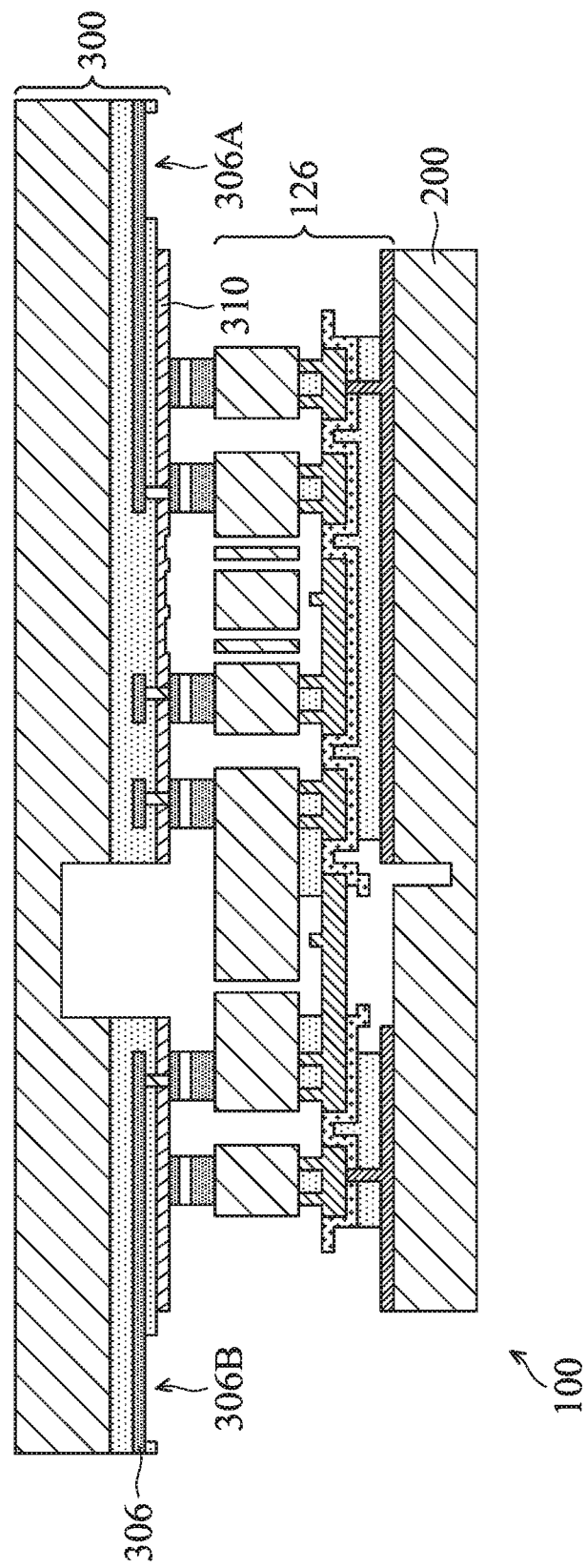
Figure 1Z:
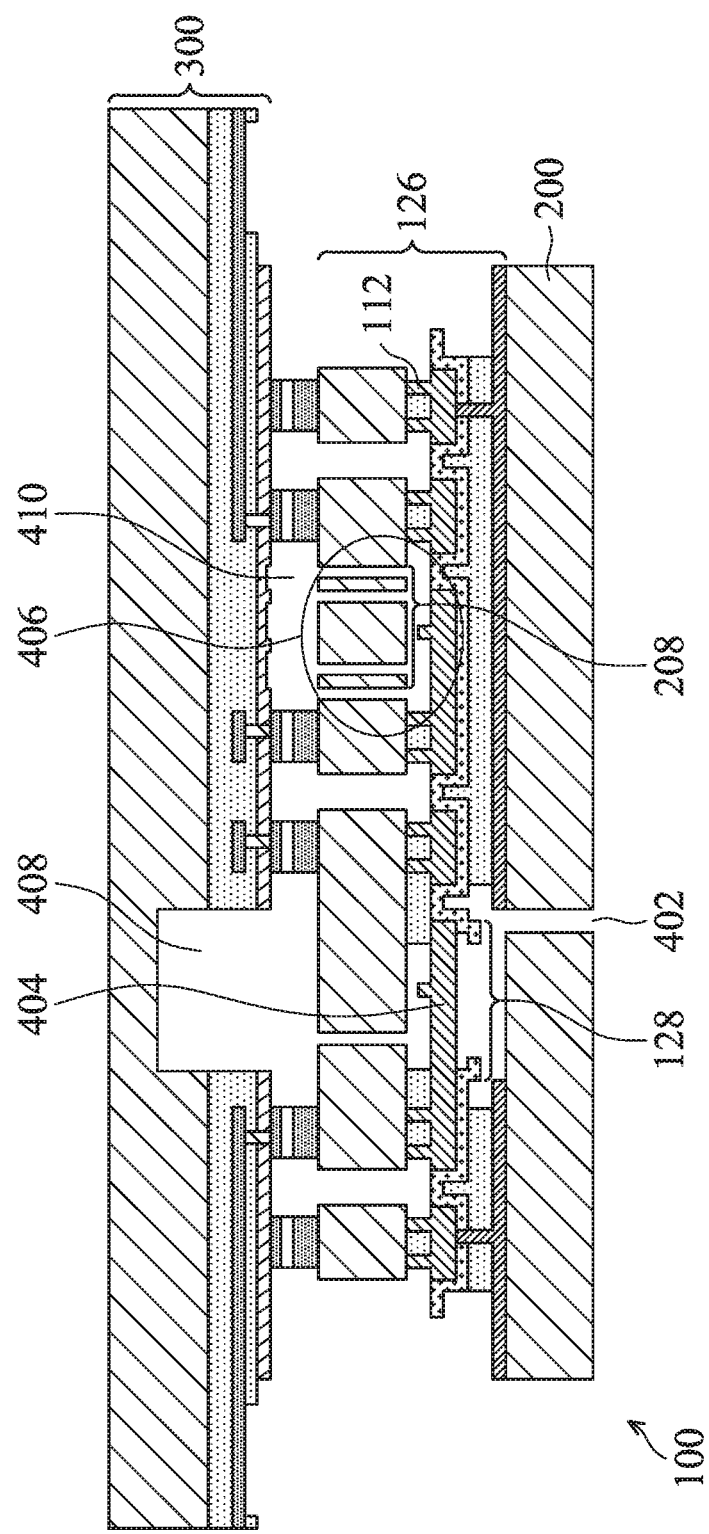

FIGS. 1A-1Z illustrate cross-sectional views of intermediate stages of manufacture of a portion of a MEMS device 100 having a pressure sensor 404 and another device 406 (see FIG. 1Z). Device 406 may be a MEMS motion sensor, a gyroscope, an accelerometer, or the like. Pressure sensor 404 and device 406 are manufactured using the same integrated circuit (IC) process to create sealed cavities (i.e., cavities 408 and 410) and an ambient environment opening (i.e., opening 402) in MEMS device 100. Therefore, various embodiments illustrated by FIGS. 1A-1Z allow for the smooth integration of manufacturing a MEMS pressure sensor device using known IC manufacturing techniques.

As shown in FIG. 1A, MEMs device 100 includes a substrate 102 and a dielectric layer 104, referred to as oxide release layer 104. Substrate 102 may be formed of silicon, or other materials such as silicon germanium, silicon carbide, or the like. Substrate 102 may be formed of low resistive silicon. Alternatively, substrate 102 may be a silicon-on-insulator (SOI) substrate. SOI substrate may comprise a layer of semiconductor material (e.g., silicon, germanium, and the like) formed over an insulator layer (e.g., buried oxide), which is formed in a silicon substrate. In addition, other substrates that may be used include multi-layered substrates, gradient substrates, hybrid orientation substrates, and the like.

Oxide release layer 104 may be formed of a low-k dielectric material, such as silicon dioxide ($SiO_2$). Oxide release layer 104 may be deposited over substrate 102 using, for example, spinning, chemical vapor disposition (CVD), plasma enhanced chemical vapor deposition (PECVD), low pressure CVD, thermal oxidation, or other suitable deposition techniques as are known in the art. Furthermore, oxide release layer 104 may be formed of a different suitable material such as low-k dielectrics such as carbon doped oxides, extremely low-k dielectrics such as porous carbon doped silicon dioxide, a polymer such as polyimide, combinations thereof, or the like. Oxide release layer 104 may be released (i.e., removed) in subsequent process steps in order to form MEMS structures; therefore, oxide release layer 104 may also be referred to as sacrificial (SAC) oxide layer 104 or sacrificial layer 104.

FIG. 1B illustrates the patterning of oxide release layer 104 to include openings 106. This may be done, for example, using a combination of photolithography and etching techniques. In FIG. 1C, upper portions of openings 106 are seamed together, sealing openings 106, which may now be referred to as voids 106. Openings 106 may be seamed together using, for example, an oxide deposition process applied to the upper surface of oxide release layer 104. For example, the deposition of additional oxide material over oxide release layer 104 may be employed to seal off the upper portions of openings 106. The oxide deposition may be formed using a deposition process such as CVD or the like. More particularly, by controlling the deposition process, the material of oxide release layer 104 may be deposited in a non-conformable manner. That is, the material of oxide release layer 104 may build up on the upper portions of openings 106 faster than along the sidewalls and bottom of openings 106. This process leads to the formation of an overhang at the edge of the upper portion of opening 106, and as the deposition process continues, the overhangs will merge, sealing off opening 106 with a plurality of seams and forming voids 106.

Voids 106 may be included in oxide release layer 104 to decrease release time in subsequent process steps. That is, the inclusion of voids 106 creates weak spots in oxide release layer 104 that reduces releasing time of MEMS structures. Alternatively, the steps shown in FIGS. 1B and 1C may be omitted if release time speed is not a concern, or an alternative design for a MEMS device includes different methods of decreasing release time.

In FIGS. 1D and 1E, oxide release layer 104 is patterned, creating bump openings 108 and via openings 110. The patterning of oxide release layer 104 may be done using, for example, a combination of photolithography and etching techniques. Two separate photolithography steps may be performed in order to create bump openings 108 and via openings 110. For example, a shallow etching may be performed to create bump openings 108, while a deeper etching may be performed to create via openings 110. As shown in FIGS. 1D and 1E, bump openings 108 do not extend to substrate 102 while via openings 110 do extend to and expose portions of substrate 102. Furthermore, oxide release layer 104 may be thinned (not shown) until a desired thickness is achieved. The thinning process may be implemented by using suitable techniques such as grinding, polishing, and/or chemical etching. For example, a chemical mechanical polishing (CMP) process may be used to thin oxide release layer 104. In accordance with various embodiments, the thickness of oxide release layer 104 is in a range from about 0.5 μm to about 5 μm.

In FIG. 1F, a dielectric layer 112 is deposited over oxide release layer 104 using, for example, CVD. Dielectric layer 112 may be made of polysilicon, and may be referred to as polysilicon layer 112 hereinafter. Polysilicon layer 112 fills via openings 110 and bump openings 108, forming polysilicon vias 112A and polysilicon bumps 112B respectively. Polysilicon vias 112A may be formed for electrical routing and may further act as a mechanical structure. For example polysilicon vias 112A may be used as a vapor hydrogen-fluoride (vapor HF) etch stop layer in subsequent process steps. Furthermore, in some embodiments, polysilicon bumps 112B may be used as mechanical bumps to limit the motion of moving elements in MEMS device 100, or anti-stiction bumps. In alternative embodiments, layer 112 may be formed of a different material in lieu of polysilicon such as SiGe, single crystal silicon (e.g., by using a silicon-on-insulator wafer as a starting material), and the like. It should be noted that while a single polysilicon layer is illustrated, those skilled in the art will recognize that multiple polysilicon layers could be employed.

An oxide mask layer 114 may be formed and patterned over a portion of polysilicon layer 112. Oxide mask layer 114 is formed out of a similar material and using similar methods as oxide release layer 104, and oxide mask layer 114 may be patterned using for example, a combination of photolithography and etching. Oxide mask layer 114 acts as protection for critical portions of polysilicon layer 112 in subsequent process steps. For example, in FIG. 1F, oxide mask layer protects portions of polysilicon layer 112 to ensure proper thickness control and surface texture. Oxide mask layer 114 may be formed over any portion of polysilicon layer 112 where such control is desired. If surface texture and thickness is not crucial, oxide mask layer 114 may be omitted.

In FIG. 1G, polysilicon layer 112 is patterned using for example a combination of photolithography and etching. The patterning of polysilicon layer 112 may be done in order to create portions of various devices in MEMS device 400. For example, the patterning of polysilicon layer 112 in FIG. 1G creates separate portions of polysilicon layer 112 for inclusion in as a bottom electrode of a motion sensor (or other applicable device) and a membrane of a pressure sensor respectively.

In FIG. 1H, etch stop layer 116 is formed and patterned over oxide release layer 104 and polysilicon layer 112. Etch stop layer 116 may be deposited using, for example, low pressure chemical vapor deposition (LPCVD), and etch stop layer 116 may be patterned using, for example, a combination of photolithography and etching. Etch stop layer 116 is patterned to include release holes 117 and to expose portions of oxide mask layer 114. Release holes 117 provide a path to remove portions of oxide release layer 104 in subsequent process steps. Etch stop layer 116 may be used as a vapor HF etch stop layer and may be formed of a low-stress nitride (LSN). However, other materials such as aluminum nitride, aluminum oxide, silicon carbide, or other dielectrics chemically resistant to vapor HF may be used as well.

FIG. 1I illustrates the formation and patterning of another oxide release layer 118. Oxide release layer 118 formed of substantially the same material and using substantially the same methods as oxide release layer 104. The thickness of oxide release layers 118 and 104 may be designed to control parasitic feedback through capacitance and/or the gap between the subsequent movable element of MEMS device 100 and the polysilicon layer 122 (see FIG. 1J). Oxide release layer 118 may be blanket deposited and then undergo a thinning process (e.g., CMP or etch-back) to reach a desired flatness and/or thickness. Oxide release layer 118 is patterned to create via openings 120 using for example, a combination of photolithography and etching.

FIG. 1J illustrates the formation of a thin polysilicon layer 122 over oxide release layer 118. Thin polysilicon layer 122 may formed on oxide release layer 118 using suitable techniques such as CVD, and the like. Thin polysilicon layer 122 is deposited into via openings 120, creating via portions 122A connected to polysilicon layer 112. Thin polysilicon layer 122 acts as electrical routing (e.g., using via portions 122A). Thin polysilicon layer 122 also acts as a shield for various components of MEMS device 100 (e.g., substrate 102 and polysilicon layer 112) in subsequent process steps. Thin polysilicon layer 122 also acts as a bonding interface layer; therefore, other suitable bonding materials such as silicon, amorphous silicon, silicon doped with impurities, combinations thereof, and the like may be used in lieu of polysilicon.

In FIG. 1K, portions of thin polysilicon layer 122 and oxide release layer 118 are etched, creating openings 124. This may be done using, for example, a combination of wet and dry etching techniques. Notably, one of the openings 124 (124A) exposes region 128 of polysilicon layer 112. Region 128 of polysilicon layer 112 may act as a membrane of a pressure sensor device in completed MEMS device 100 (e.g., see element 404 in FIG. 1Z). In a completed MEMS device 100, opening 124A exposes this portion of polysilicon layer 112 to a certain level of pressure (e.g., ambient pressure or sealed pressure depending on the design of MEMS device 100). The etching of thin polysilicon layer 122 and oxide release layer 118 completes a MEMS wafer 126 of MEMS device 100. MEMS wafer 126 has a top and bottom surface, 126A and 126B respectively.

In FIG. 1L, MEMS wafer 126 is bonded to carrier wafer 200. FIG. 1M illustrates a more detailed view of a carrier wafer 200. Carrier wafer 200 may be a substrate that is substantially similar to substrate 102 in MEMS wafer 126. Carrier wafer 200 is patterned to include openings 201 using for example etching techniques adopting an etching loading effect. Carrier wafer 200 also has a top and bottom surface, 200A and 200B respectively. Top surface 126A of MEMS wafer 126 is bonded to top surface 200A of carrier wafer 200.

Openings 124 of MEMS wafer 126 may be aligned to openings 201 of carrier wafer 200. MEMS wafer 126 may be bonded to carrier wafer 200 using any suitable technique such as fusion bonding, anodic bonding, eutectic bonding, and the like. For example, in various embodiments, MEMS wafer 126 may be fusion bonded to carrier wafer 200 using thin polysilicon layer 122 as a bonding interface.

Furthermore, MEMS wafer 126 may be thinned to a desired thickness T3. The thinning process may include grinding and chemical mechanical polishing (CMP) processes, etch back processes, or other acceptable processes performed on surface 126B of MEMS wafer 126 (i.e., substrate 102). As a result of this thinning process, MEMS wafer 126 may have a thickness between about 5 µm to about 60 µm.

In FIG. 1N, conductive bonds 202 are formed and patterned over substrate 102 (i.e., bottom surface 126B of MEMS wafer 126). Conductive bonds 202 may be formed of aluminum copper (AlCu) and are used for eutectic bonding in subsequent process steps. Alternatively, a different conductive material suitable for eutectic bonding such as Ge, Au, combinations thereof, or the like may be used instead.

In FIG. 1O, portions of substrate 102 are patterned forming openings 204 using for example, a combinations of photolithography and etching. The portions of the remaining substrate 102 may form various MEMS structures (e.g., MEMS structures 206 and 208). MEMS structure 206 may act as a bottom electrode of a pressure sensor device in finished MEMS device 100. MEMS structure 208 may be patterned to act as a proof mass of a motion sensor device in finished MEMS device 100. Alternatively, MEMS structure 208 may also be patterned to be portions of other MEMS devices such as a spring (e.g., for a gyroscope), a series of fingers in a comb (e.g., for an accelerometer), or the like.

FIG. 1P illustrates the release of the MEMS structures 206 and 208 by a vapor HF etching of portions of oxide release layers 104 and 118. This type of etch process has a high selectivity between oxide release layers 104 and 118, etch stop layer 116, polysilicon layer 112, thin polysilicon layer 122, and carrier wafer 200 so that that polysilicon layers 112 and 122, carrier wafer 200, and etch stop layer 116 are not significantly attacked during the removal of portions of oxide release layers 104 and 118. Furthermore, polysilicon layer 112 (e.g., vias 112A) and etch stop layer 116 protects portions of oxide release layers 104 and 118 during the etch process, and these protected regions may be referred to as anchor regions. This etch process allows for free movement of the movable elements of MEMS structure 208 in at least one axis. Furthermore, MEMS structure 206 may be designed to be stiff and having a relatively limited range of motion even after the vapor HF process. It should be noted that the portions of the oxide release layers to be removed depend on layout design.

FIGS. 1Q-1V illustrate various intermediary steps of manufacture of a cap wafer 300 for inclusion in the completed MEMS device 100. Cap wafer 300 may or may not be a semiconductor wafer (e.g., a CMOS wafer), which may or may not have electrical circuits (not shown). In particular cap wafer 300 may include various active devices such as transistors, capacitors, resistors, diodes, photodiodes, fuses and the like. The electrical circuits may be interconnected to perform one or more functions suitable for a particular application, which may or may not be related to MEMS device 100. FIG. 1Q illustrates cap wafer 300 as having substrate 302, oxide layer 304, and patterned metal lines 306. Substrate 302 and oxide layer 304 may be substantially similar to substrate 102 and oxide layer 104 in MEMS wafer 126. Metal lines 306 may be formed of aluminum copper (AlCu) and may be used for electrical routing. Alternatively, metal lines 306 may be formed of another suitable metallic material.

In FIG. 1R, a conforming oxide layer 308 is formed over metal lines 306. Conforming oxide layer 308 may be deposited using any suitable technique, such as CVD, and the like and may be a low-k dielectric material. The formation of conforming oxide layer 308 may include a grinding process (e.g., CMP) to achieve a desired topography and thickness. A film layer 310 is deposited over conforming oxide layer 308 using a suitable technique such as CVD. In some embodiments, film layer 310 is formed of silicon nitride and is used as a passivation layer. Alternatively, film layer 310 may be formed of a dielectric material such as an oxide, a metal, combinations thereof, or the like. In subsequent process steps, portions of film layer 310 may be patterned to crate mechanical bumps in cap wafer 300.

FIG. 1S illustrates insertion of contact plugs 311 into cap wafer 300. Contact plugs 311 may be formed of tungsten, although other metallic materials such as aluminum or copper may also be used. Contact plugs 311 may be formed for example, by patterning film layer 310 and conforming oxide layer 308, exposing metal lines 306. A metallic material, e.g., tungsten, may be deposited in the patterned openings and a CMP technique may be used so that the top surface of contact plugs 311 may be level with the top surface of film layer 310. Contact plugs 311 are electrically connected to metal lines 306.

In FIG. 1T, bonding material layers 312 (alternatively referred to as bonds 312) are formed over a top surface of film layer 310. Bonding material layers 312 may be blanket deposited and patterned using for example physical vapor deposition (PVD) and photolithography/etching. Bonding material layers 312 may be made of a layer of aluminum copper under a layer of germanium although other metallic materials such as gold may also be used. Bonding material layers 312 may act as a eutectic bonding material for a subsequent bonding process. Bonding material layers 312 may or may not be electrically connected to metal lines 306 via contact plugs 311.

In FIG. 1U, a shallow etching is performed on portions of film layer 310. Portions of film layer 310 may be shallow etched to facilitate the exposure of portions of metal line 306 in a subsequent process step. Furthermore, the etching of film layer 310 may form bumps 314. Bumps 314 may serve a variety of purposes. For example, in an embodiment bumps 314 are mechanical bumps included to limit the motion of moving elements in MEMS device 100. Bumps 314 may also be used as anti-stiction bumps.

In FIG. 1V, a cavity 316 is formed in cap wafer 300. Cavity 316 may function as a sealed cavity in a pressure sensor device of MEMS device 100. The formation of cavity 316 may include known etching techniques.

FIG. 1W illustrates the stacked MEMS device 100, wherein cap wafer 300 is stacked over MEMS wafer 126 and carrier wafer 200. Cap wafer 300 may be bonded to MEMS wafer 126 by eutectic bonding between the bonds 202 and bonds 312. As shown in FIG. 1W, through the eutectic bonding process, moveable elements (e.g., MEMS structure 206 and 208) may be located between a polysilicon layer 112 and cap wafer 300. Furthermore, Cap wafer 300 and MEMS wafer 126 are aligned so that cavity 316 and bumps 314 are aligned with MEMS structure 206 and MEMS structure 208 respectively. MEMS structures 206 and 208 are disposed in sealed cavities defined by the eutectic bonding. That is, in a top-down view of portions of MEMS device 100 (see FIG. 3), at least a portion of the eutectic bonds formed between bonds 202 and 312 form closed loops, sealing MEMS structures 206 and 208 in enclosed cavities.

In FIG. 1X, a grinding process is performed to remove portions of MEMS wafer 126 and carrier wafer 200. The grinding may also be referred to as an open pad grinding (OPG) exposing portions of cap wafer 300 and may be done using known grinding techniques. The OPG may be facilitated by the inclusion of openings 201 in carrier wafer 200 (see FIG. 1W). That is, portions of MEMS wafer 126 and carrier wafer 200 may be easily removed by removing a small portion of carrier wafer 200 (defined by the placement of openings 201). In FIG. 1Y, portions of film layer 310 and conforming oxide layer 308 may also be removed (e.g., using dry etch) to expose portions of metal lines 306. These exposed portions of metal line 306 (i.e., portions 306A and 306B) may be used as input/output pads to electrically couple circuits in cap wafer 300 to external circuits (not shown).

In FIG. 1Z, portions of carrier wafer 200 may be removed to expose cavity 402 to ambient pressure. That is, cavity 402 is exposed to an open air environment. The removal of portions of carrier wafer 200 may include known etching techniques such as CMP, etch-back, or the like.

FIG. 1Z illustrates a completed MEMS device 100 in accordance with various embodiments. MEMS device 100 includes a pressure sensor 404 and a device 406. Pressure sensor 404 includes a membrane (i.e., region 128 of polysilicon layer 112) and an electrode (i.e., MEMS structure 206). The membrane is exposed to ambient pressure on one surface (e.g., through cavity 402) and sealed pressure on the other surface (e.g., through sealed cavity 408). The pressure of sealed cavity 408 may be defined by the conditions of the eutectic bonding process between MEMS wafer 126 and cap wafer 300. For example, the eutectic bonding process may be performed in chamber having a certain pressure level to define an appropriate pressure level of sealed cavities 408 and 410 (explained in greater detail below). Therefore, pressure sensor 404 may detect ambient pressure by comparing the difference between cavity 402 and sealed cavity 408.

Device 406 may be a motion sensor that allows for the detection of motion through the disposition of a proof mass (i.e., MEMS structure 206) over an electrode (i.e., portions of polysilicon layer 112) in a sealed cavity 410 having pressure defined by eutectic bonding. Alternatively, device 406 may be an accelerometer, a gyroscope, or the like. The pressure of sealed cavity 410 may be selected in accordance with the desired functionality of device 406. For example, sealed cavity 410 may have a pressure between about 100 mbar to about 700 mbar for an accelerometer, between about $10^{-4}$ mbar to about 10 mbar for a gyroscope, or the like. Thus, using the various formation steps illustrated in FIGS. 1A-1Z, a pressure sensor and another MEMS device may be formed using the same MEMS manufacturing process.

FIGS. 2A-2I illustrate cross-sectional views of various stages of manufacture of a MEMS device in accordance with alternative embodiments.

Figure 2A:
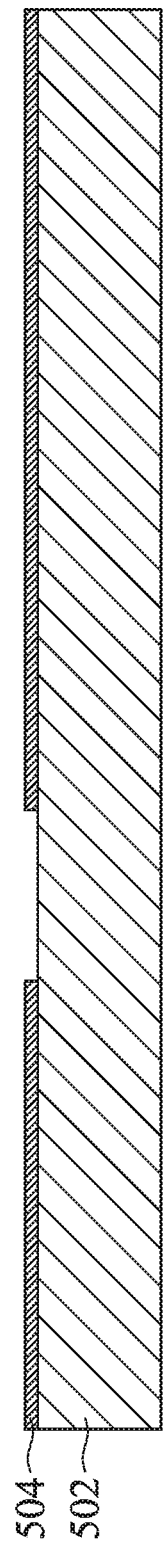

In FIG. 2A, a cross-sectional view of a carrier wafer 500 is shown. Carrier wafer 500 includes a substrate 502 and a dielectric layer 504. Substrate 502 may be a silicon substrate, while dielectric layer 504 may be a thermal oxide layer formed by performing a thermal oxidation on carrier wafer 500. Dielectric layer 504 may be patterned using for example a combination of photolithography and etching.

Figure 2B:
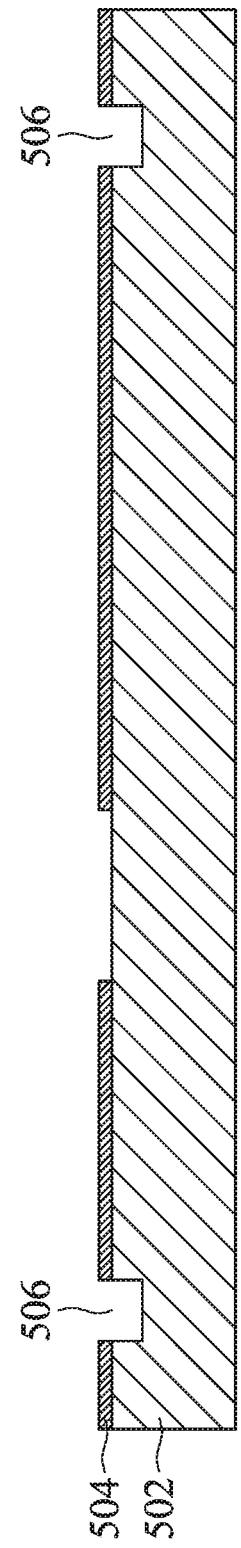

In FIG. 2B, portions of substrate 502 and dielectric layer 504 are patterned using for example a combination of photolithography and etching.

In FIG. 2C, deep cavities 506 and 508 are formed using dielectric layer 504 as a mask. Deep cavities 506 and 508 may be formed using, for example, a deep-reactive-ion etching (DRIE) process on substrate 502. Alternatively, if deep cavities are not required in the design of a MEMS device, dielectric layer 504 and the deep etching step may be omitted, and substrate 502 may be patterned and etched using other techniques (e.g., photolithographic techniques).

Figure 4A:
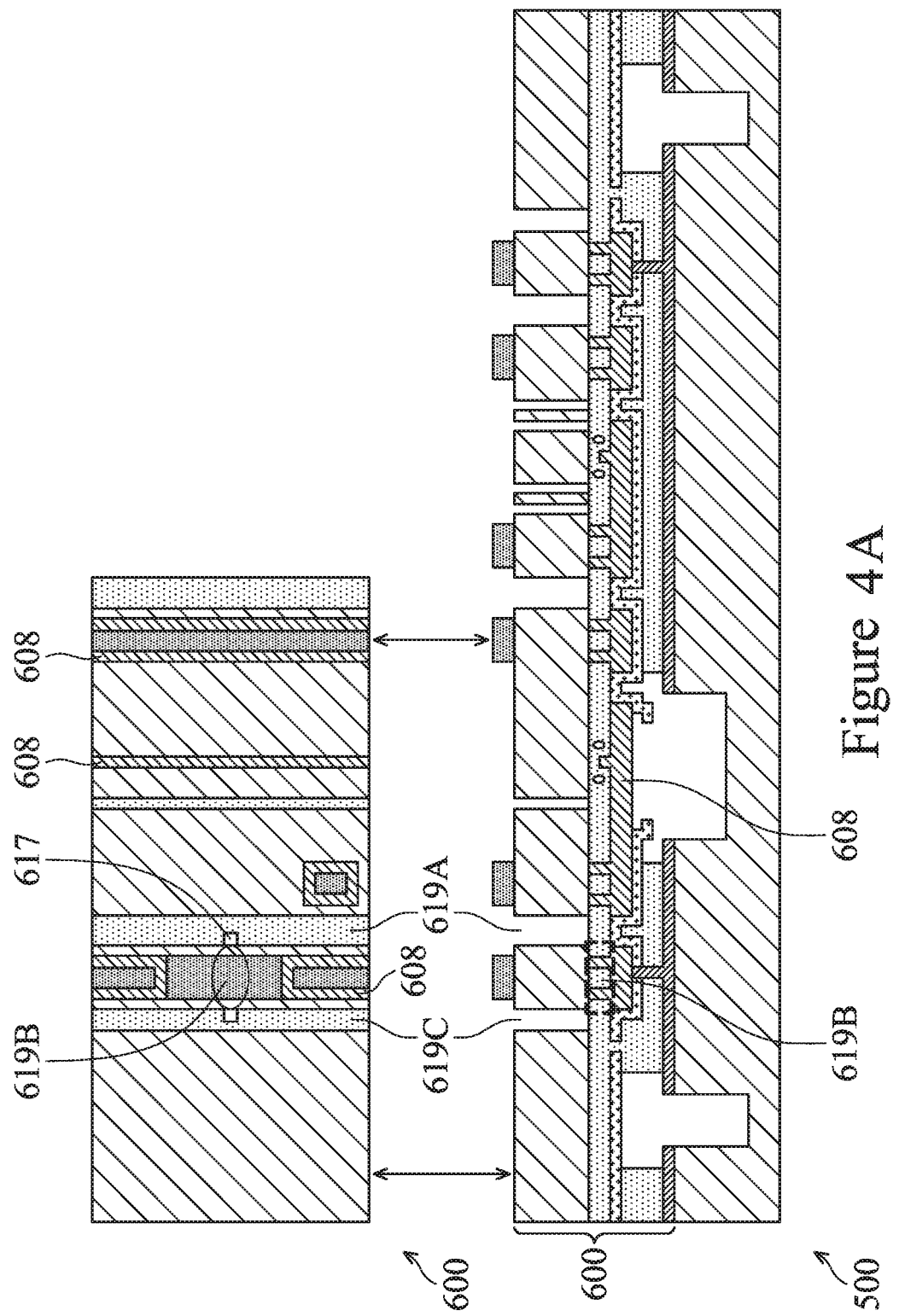
FIGS. 4A-4C are varying cross-sectional and top-down views of a MEMS wafer in accordance with various alternative embodiments.

FIG. 2D illustrates carrier wafer 500 bonded to a MEMS wafer 600. Carrier wafer 500 may be bonded to MEMS wafer 600 using known bonding techniques such as fusion bonding, and the like. MEMS wafer 600 may be substantially similar to MEMS wafer 126 and may be formed using substantially similar process steps. Specifically, MEMS wafer 126 includes a substrate 602, oxide release layers 604, etch stop layer 606, polysilicon layer 608, and thin polysilicon layer 610. Therefore, extensive description on the formation of MEMS wafer 600 is omitted for brevity. However, MEMS wafer 600 includes a trench 617 in area 619B of oxide release layer 604, which may be more readily visible from a top down view of MEMS wafer 600 (see FIG. 4A illustrating a cross-sectional and corresponding top-down view of MEMS wafer 600). As explained in greater detail in subsequent paragraphs, trench 617 helps form a leak path to ambient environment in the completed MEMS device 800. Notably, polysilicon layer 608 (shown in ghost in FIG. 4A's top-down view of MEMS wafer 600) may be patterned so as to not obstruct trench 617.

Thin polysilicon layer 610 may be used as a bonding layer to bond MEMS wafer 600 to carrier wafer 500. Furthermore, polysilicon layer 608 includes portion 608A which is aligned and exposed to deep cavity 508. In the completed MEMS device, portion 608A of polysilicon layer 608 may function as a membrane of a pressure sensor device.

Figure 2E:
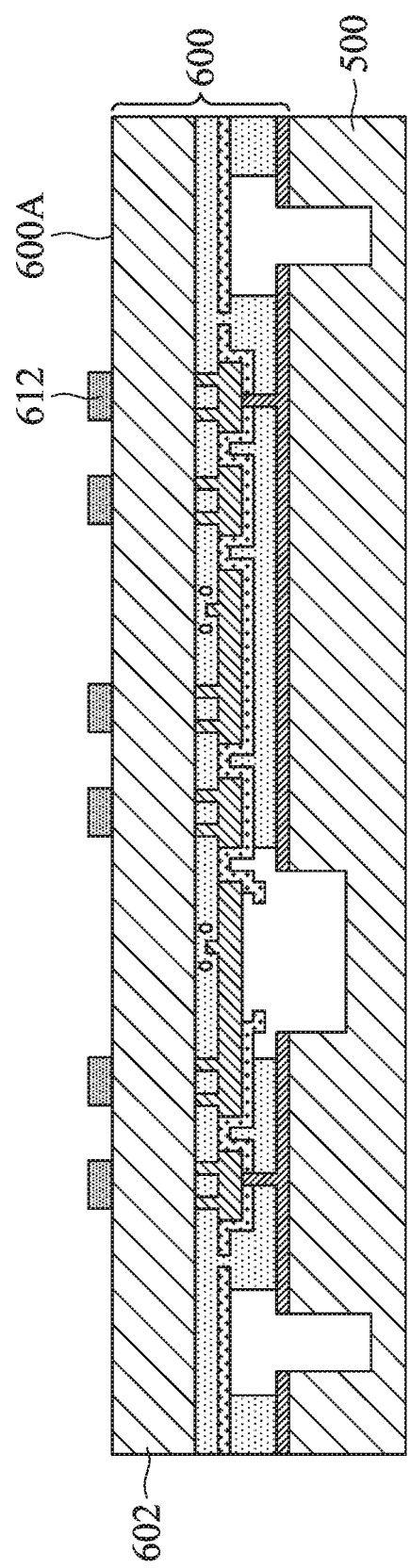

In FIG. 2E, conductive bonds 612 are formed and patterned over substrate 602 (i.e., surface 600A of MEMS wafer 600). Conductive bonds 612 may be formed of aluminum copper (AlCu) and are used for eutectic bonding in subsequent process steps. Alternatively, a different conductive material suitable for eutectic bonding such as Ge, Au, combinations thereof, or the like may be used instead.

Figure 2F:
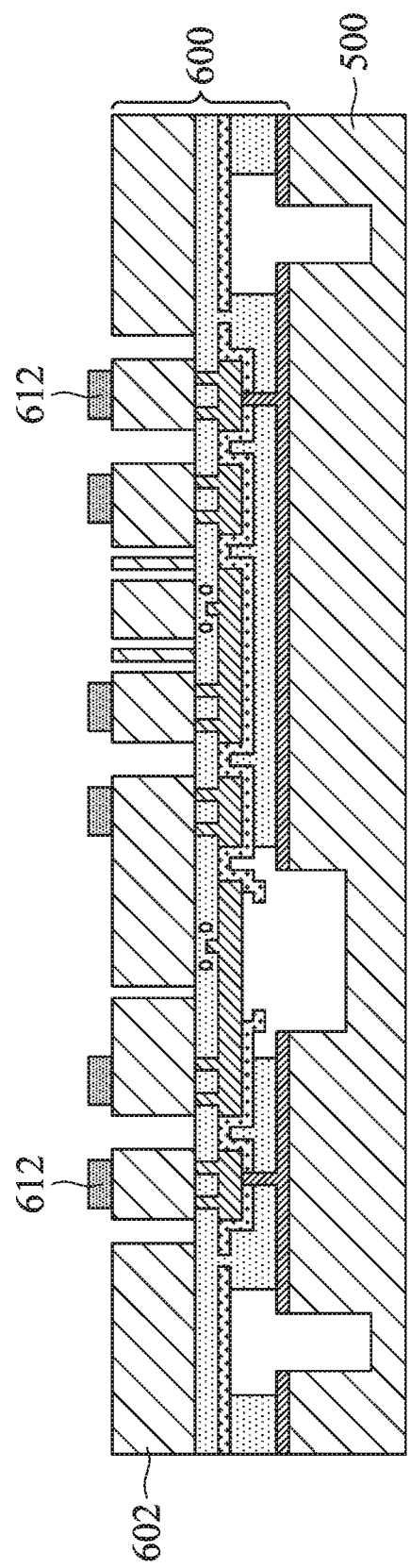

In FIG. 2F, portions of substrate 602 are patterned using for example, a combinations of photolithography and etching. The portions of the remaining substrate 602 may form various MEMS structures (e.g., structures 614 and 616 in FIG. 2G).

Figure 2G:
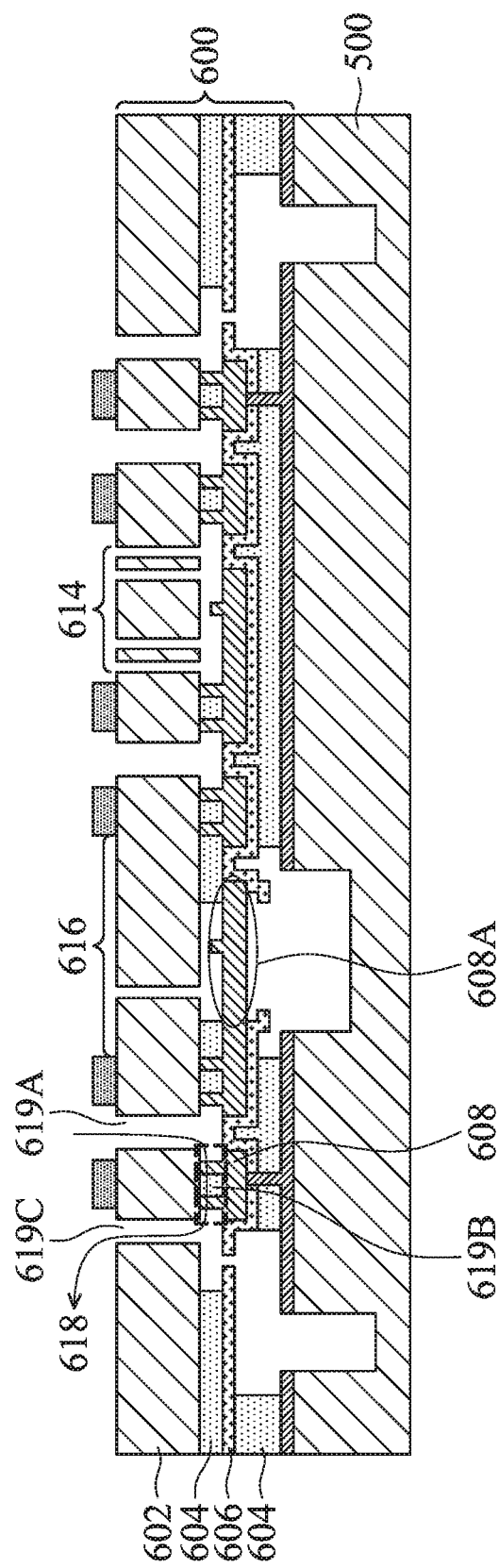

FIG. 2G illustrates the release of the MEMS structures 614 and 616 by a vapor HF etching of portions of oxide release layers 604. This type of etch process has a high selectivity between oxide release layers 604, etch stop layer 606, polysilicon layer 608, thin polysilicon layer 610, and carrier wafer 500 so that that polysilicon layers 608 and 610, carrier wafer 500, and etch stop layer 606 are not significantly attacked during the removal of portions of oxide release layers 604. Furthermore, polysilicon layer 608 protects portions of oxide release layers 604 during the etch process, and these protected regions may be referred to as anchor regions. This etch process allows for free movement of the movable elements of MEMS structures 614 in at least one axis. Furthermore, MEMS structure 616 may be designed to be relatively immobile even after the vapor HF process. It should be noted that the oxide release layers to be removed depend on layout design.

Figure 4B:
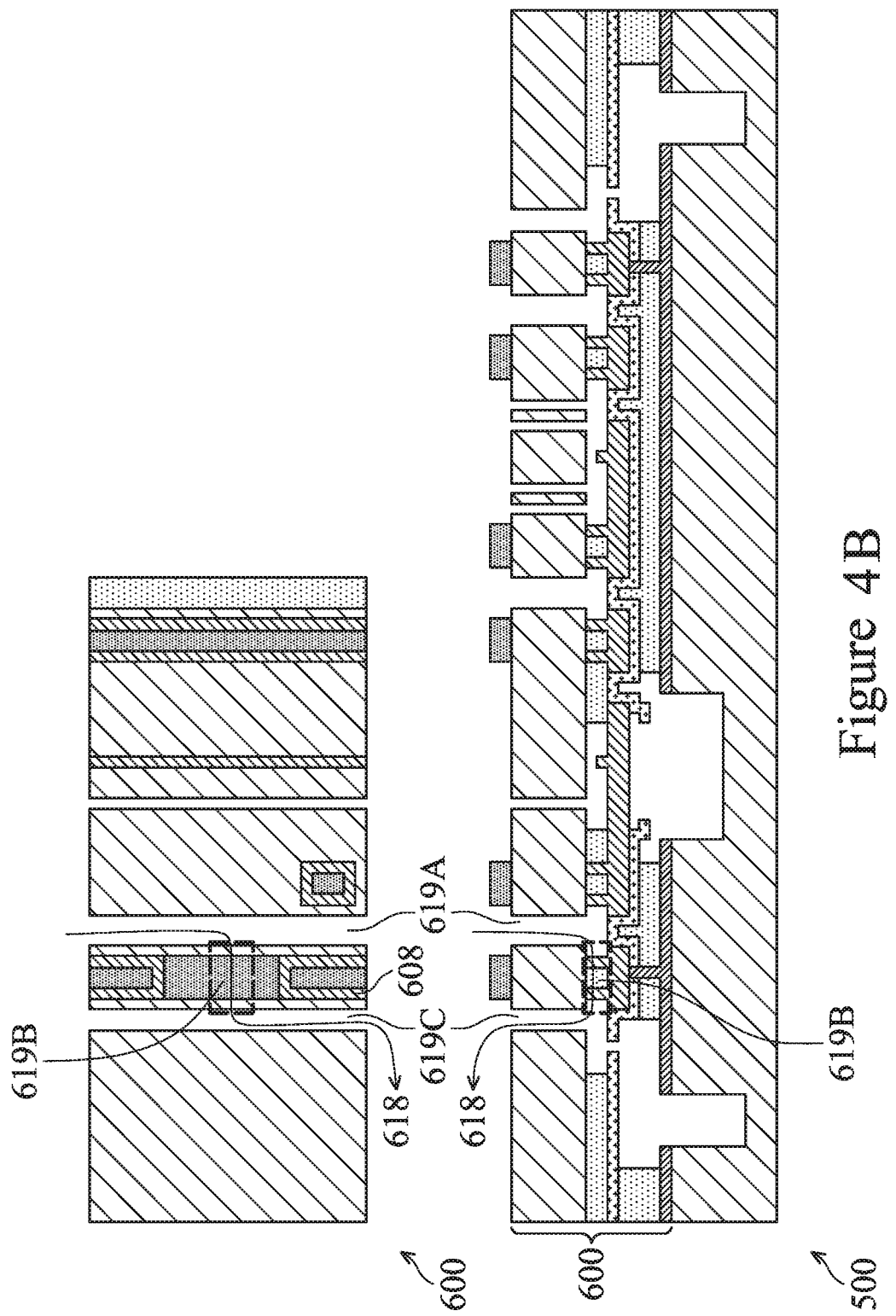

Furthermore, FIG. 2G illustrates the formation of a leak path 618 to ambient pressure due to the vapor HF etch process. Leak path 618 may be formed, for example, by including a trench connecting area 619A and 619C through area 619B in the formation/design of MEMS wafer 600 (see FIG. 4A). That is, a trench may have been included in area 619B between substrate 602 and polysilicon layer 112 that is unobstructed by polysilicon layer 608. After the vapor HF etch process, leak path 618 may be formed allowing for free flow of air between area 619A and 619C (see FIG. 4B illustrating a cross-sectional and corresponding top-down view of MEMS wafer 600 after the vapor HF etch process). Leak path 618 may function similarly to opening 402 in MEMS device 100.

Figure 2H:
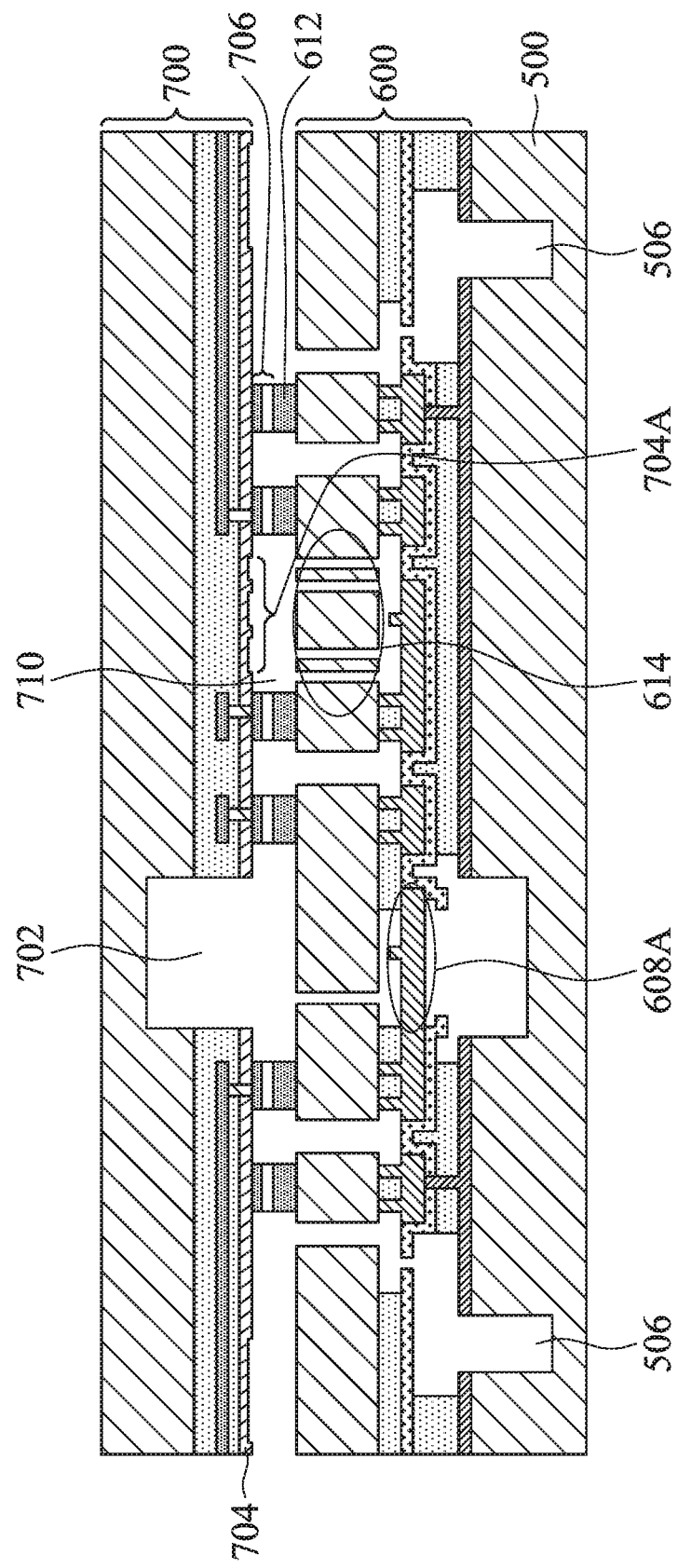
Figure 4C:
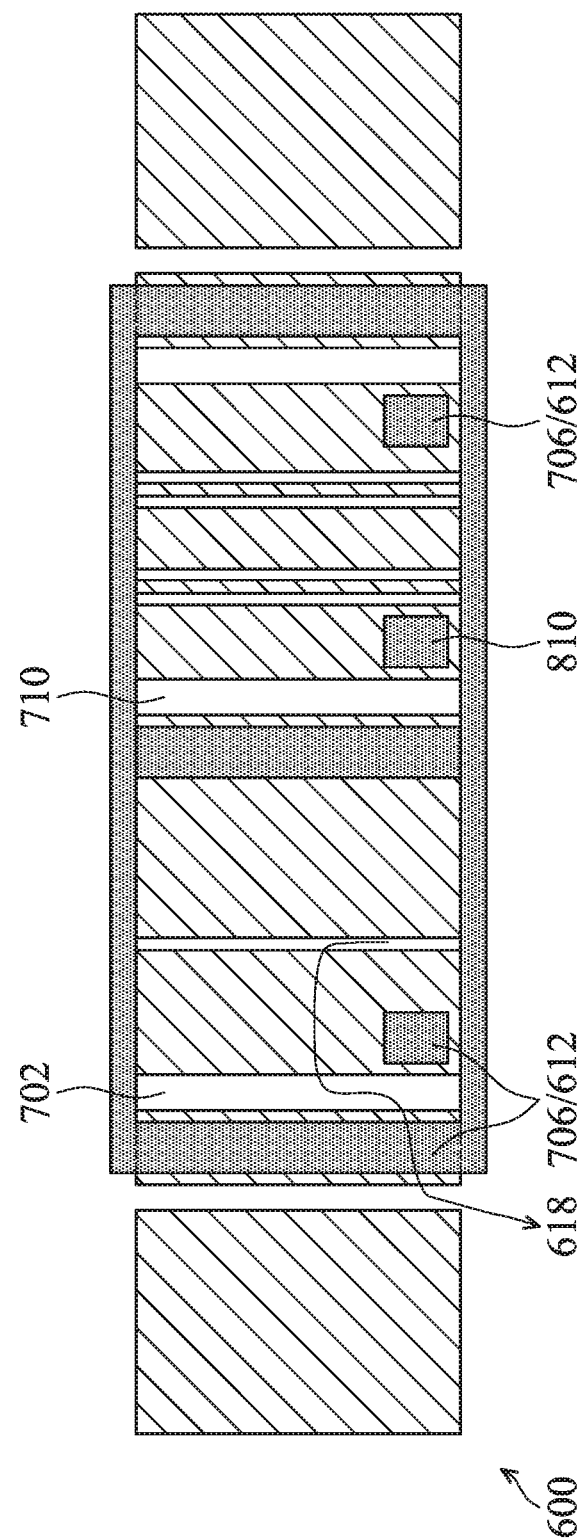

FIG. 2H illustrates the eutectic bonding of MEMS wafer 600 (bonded to carrier wafer 500) to a cap wafer 700. Cap wafer 700 includes film layer 704 (having bumps 704A), cavity 702, and metal bonds 706. Cap wafer 700 is substantially similar to cap wafer 300 in MEMS device 100, and cap wafer 700 may be formed using substantially the same process steps as cap wafer 300. Therefore, detailed description of the process steps for forming cap wafer 700 is excluded for brevity. Bonds 706 are eutectically bonded to bonds 612 of MEMS wafer 600. Cavity 702 and bumps 704A are aligned to portion 608A (i.e., a pressure sensor membrane) and MEMS structure 614 (i.e., a moving element of another device) respectively. Referring to FIG. 4C, certain bonds 706 and 612 form closed loops, creating sealed cavities 702 and 710 defined by eutectic bonding. However, certain other bonds 706 and 612 do not form closed loops and may be included for as electrical connections.

Figure 2I:
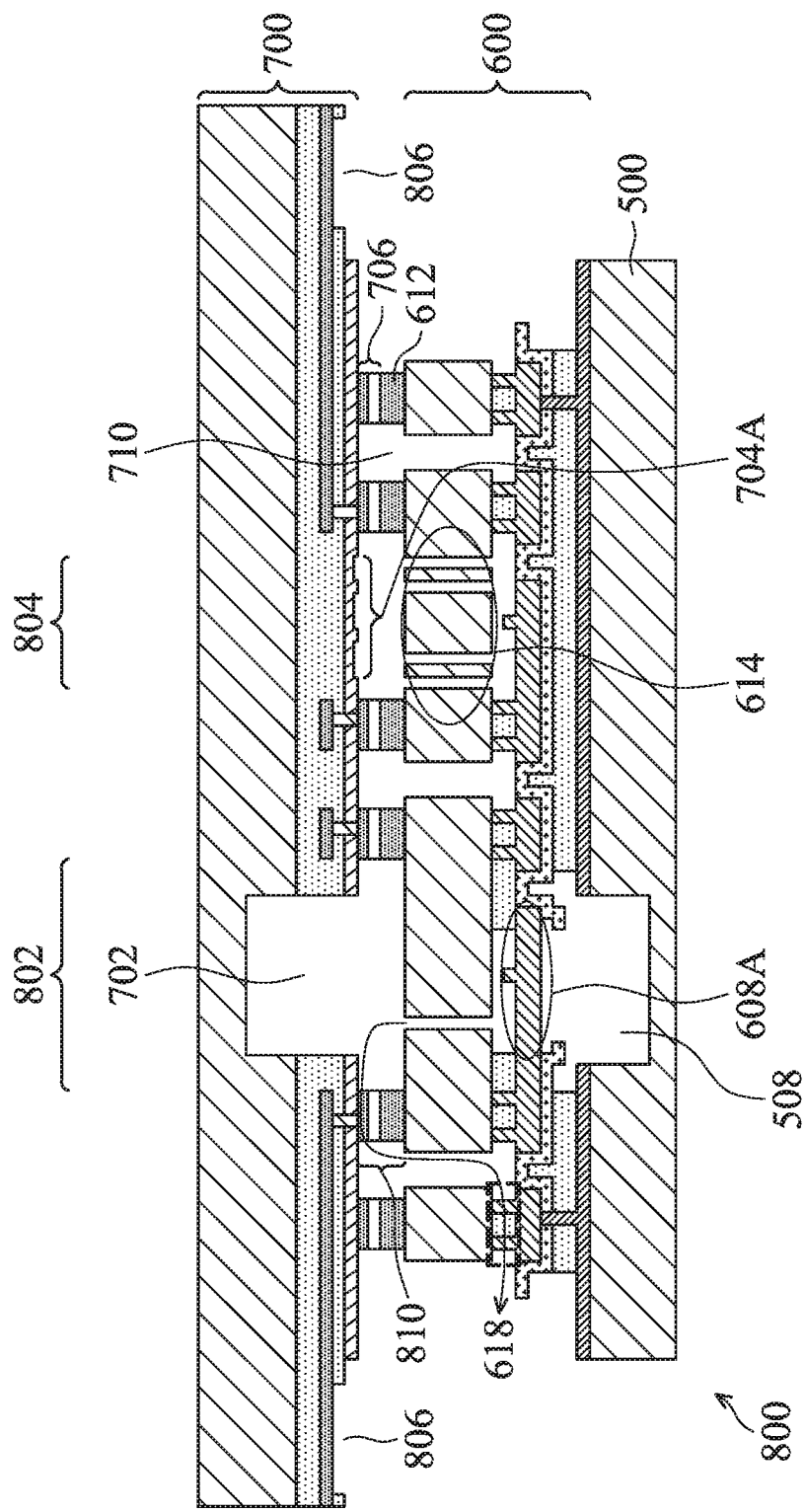

FIG. 2I illustrates completed MEMS device 800 having a pressure sensor 802 and a device 804 (e.g., a motion sensor, accelerometer, gyroscope, or the like). In FIG. 2I, a grinding has been performed on MEMS device 800 in expose input/output pads 806. The grinding may be facilitated by the inclusion of openings 506 (see FIG. 2H) in carrier wafer 500.

Pressure sensor 802 includes a polysilicon membrane (portion 608A of polysilicon layer 608), which is exposed to ambient pressure on one surface and sealed pressure on the other. Cavity 508 acts as a sealed pressure chamber defined, for example, by the fusion bonding process of MEMS wafer 600 to carrier wafer 500. Cavity 702 acts as an ambient pressure chamber, wherein a leak path to ambient pressure is shown, for example, by arrow 618. Because certain eutectic bonds (e.g., bond 810) does not seal cavity 702 (i.e., see FIG. 4C), cavity 702 may be exposed to ambient pressure via leak path 618. Device 804 includes MEMS structure 614 in a sealed cavity 710 disposed between cap wafer 700 and polysilicon layer 608. Polysilicon layer 608 may act as a bottom electrode for device 804. Furthermore, the pressure level of cavity 710 is defined by the eutectic bonding process and may be selected in accordance with the desired functionality of device 804.

In accordance with an embodiment, a micro-electromechanical (MEMS) device includes a polysilicon layer, a MEMS substrate over the polysilicon layer, and a cap over the MEMS substrate. The polysilicon layer includes a membrane for a first MEMS device and an electrode for a second MEMS device. A first surface of the membrane is exposed to a sealed pressure level of a first cavity. The MEMS substrate comprises a first MEMS structure aligned with the membrane and a second MEMS structure aligned with the electrode. The cap comprises a second cavity exposing a second surface of the membrane to an ambient environment and a third cavity. The electrode is exposed to a sealed pressure level of the third cavity, and the second MEMS structure is disposed within the third cavity.

A micro-electromechanical (MEMS) device includes a MEMS portion having a polysilicon layer comprising a first portion and a second portion, a first MEMS structure aligned with the first portion of the polysilicon layer, and a second MEMS structures aligned with the second portion of the polysilicon layer. A carrier is bonded to the MEMS portion. The carrier comprises a first cavity, wherein a first surface of the first portion of the polysilicon layer is exposed to ambient pressure through the first cavity. A portion of the carrier aligned with the second portion of the polysilicon layer is substantially free of any cavities. A cap is bonded to an opposing surface of the MEMS portion as the carrier. The cap and the MEMS portion define a second cavity and a third cavity. The first MEMS structure is disposed in the second cavity, and a second surface of the first portion of the polysilicon layer is exposed to a sealed pressure level of the second cavity. The second MEMS structure and the second portion of the polysilicon layer are disposed in the third cavity.

A semiconductor device includes a polysilicon layer comprising a first portion configured as a membrane of a pressure sensor device and a second portion configured as an electrode for a motion sensor, a gyroscope, or an accelerometer. The semiconductor device further includes a first sealed cavity aligned with the membrane and a second cavity aligned with the membrane. A first surface of the membrane is exposed to a first pressure level of the first sealed cavity, and the second cavity exposes a second surface of the membrane to an ambient pressure level. A first micro-electromechanical (MEMS) structure is aligned with the membrane, and a second MEMS structure is aligned with the electrode and adjacent the first MEMS structure. A third sealed cavity is aligned with the electrode, and the second MEMS structure is disposed within the third cavity.

In accordance with an embodiment, a method includes providing a device substrate including a membrane for a first micro-electromechanical (MEMS) device and bonding a carrier having a first cavity to the device substrate. Bonding the carrier includes aligning the first cavity with a first surface of the membrane. The method further includes patterning the device substrate to define a first MEMS structure aligned with the membrane, bonding a cap to the device substrate to form a second cavity including a second surface of the membrane and the first MEMS structure, and patterning the carrier to expose the first cavity to ambient pressure.

In accordance with an embodiment, a method includes providing a device substrate including a membrane for a pressure sensor device and bonding a carrier to the device substrate to define a first cavity. A first surface of the membrane is exposed to a pressure level of the first cavity. The method further includes patterning the device substrate to define a first micro-electromechanical (MEMS) structure aligned with the membrane and a second MEMS structure adjacent the first mems structure. The method further includes bonding a cap to an opposing side of the device substrate as the carrier. Bonding the cap defines a second cavity including the first MEMS structure and a third cavity including the second mems structure. A second surface of the membrane is exposed to an ambient pressure level through the second cavity.

In accordance with an embodiment, a micro-electromechanical (MEMS) device includes a device substrate having a membrane for a pressure sensor and a first MEMS structure over and aligned with the membrane. A first surface of the membrane is exposed to a sealed pressure level of a first cavity on and a second surface of the membrane is exposed to an ambient pressure level. The MEMS device also includes a cap over first MEMS structure and bonded to the device substrate by a plurality of eutectic bonds. The MEMS structure also includes a carrier bonded to an opposing side of the device substrate as the cap.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A micro-electromechanical (MEMS) device comprising:
   a device substrate comprising:
      a membrane for a pressure sensor, wherein a first surface of the membrane is exposed to a sealed pressure level of a first cavity and a second surface of the membrane is exposed to an ambient pressure level; and
      a first MEMS structure over and aligned with the membrane for the pressure sensor;
   a cap over first MEMS structure and bonded to the device substrate by a plurality of eutectic bonds, wherein the first cavity is at least partially defined by the plurality of eutectic bonds bonding the cap to the device substrate; and
   a carrier bonded to an opposing side of the device substrate as the cap.

2. The MEMS device of claim 1, wherein the second surface of the membrane is exposed to the ambient pressure level through an opening in the carrier.

3. The MEMS device of claim 1, wherein the first MEMS structure is disposed in the first cavity.

4. The MEMS device of claim 1, wherein the second surface of the membrane is exposed to the ambient pressure level through a second cavity connected to an opening in the device substrate.

5. The MEMS device of claim 4, wherein the first MEMS structure is disposed in the second cavity.

6. The MEMS device of claim 1 further comprising:
   a third cavity defined by the cap and the device substrate; and
   a second MEMS structure adjacent the first MEMS structure and disposed in the third cavity.

7. The MEMS device of claim 6, wherein the second MEMS structure is a component of a motion sensor, a gyroscope, or an accelerometer.

8. The MEMS device of claim 6 further comprising a plurality of anti-stiction bumps disposed in the third cavity over the second MEMS structure.

9. A micro-electromechanical (MEMS) device comprising:
   a device portion comprising:
      a polysilicon layer having a first portion providing a membrane 128 for a pressure sensor; and
      a first MEMS structure over and aligned with the membrane;
   a cap over bonded to a first side of the device portion, the device portion and the cap defining a first sealed cavity, a first surface of the membrane is disposed in the first sealed cavity, the cap comprising:
      a region extending laterally past the device portion; and
      an input/output contact in the region of the cap; and
   a carrier bonded to an opposing side of the device portion as the cap, an opening through the carrier exposing a second surface of the membrane to ambient.

10. The MEMS device of claim 9, wherein the cap is bonded to the device portion using a plurality of eutectic bonds, wherein a first one of the plurality of eutectic bonds encircles a perimeter of the first sealed cavity in a top-down view.

11. The MEMS device of claim 10, wherein the device portion further comprises a second MEMS structure disposed in a second sealed cavity, the second sealed cavity is defined by the cap and the device portion, and the first one of the plurality of eutectic bonds encircles a perimeter of the second sealed cavity in the top-down view.

12. The MEMS device of claim 11, wherein the first one of the plurality of eutectic bonds comprises a conductive portion separating the first sealed cavity from the second sealed cavity in the top-down view.

13. The MEMS device of claim 9, wherein the cap further comprises:
   a semiconductor substrate;
   an active devices on the semiconductor substrate; and
   electrical circuitry electrically connecting the active device to the input/output contact.

14. The MEMS device of claim 13, wherein the first sealed cavity extends into the semiconductor substrate of the cap.

15. A micro-electromechanical (MEMS) device comprising:
   a device substrate comprising:
      a membrane for a pressure sensor; and
      a first MEMS structure over and aligned with the membrane for the pressure sensor;
   a cap over the first MEMS structure and bonded to the device substrate by a plurality of eutectic bonds, wherein a first surface of the membrane is exposed to a sealed pressure level of a first cavity, the first cavity extends into the cap; and
   a carrier bonded to an opposing side of the device substrate as the cap, and a second surface of the membrane is exposed to an ambient pressure level through an opening in the carrier.

16. The MEMS device of claim 15 further comprising a second MEMS structure in a second cavity, the second cavity is defined by the cap and the device substrate.

17. The MEMS device of claim 16, wherein the second MEMS structure is part of a different type of MEMS device than the pressure sensor.

18. The MEMS device of claim 15, wherein the cap further comprises an input/output contact extending beyond the carrier.

19. The MEMS device of claim 18, wherein the input/output contact is at a surface of the cap facing the device substrate.

* * * * *

UNITED STATES PATENT AND TRADEMARK OFFICE
CERTIFICATE OF CORRECTION

PATENT NO. : 10,508,029 B2
APPLICATION NO. : 16/023509
DATED : December 17, 2019
INVENTOR(S) : Chia-Hua Chu et al.

Page 1 of 1

It is certified that error appears in the above-identified patent and that said Letters Patent is hereby corrected as shown below:

In the Claims

In Column 11, Line 61, Claim 9, delete "128".

Signed and Sealed this
Thirtieth Day of June, 2020

Andrei Iancu
*Director of the United States Patent and Trademark Office*